United States Patent
Sugawara

(10) Patent No.: US 8,778,746 B2
(45) Date of Patent: Jul. 15, 2014

(54) THIN-FILM TRANSISTOR DEVICE MANUFACTURING METHOD, THIN-FILM TRANSISTOR, AND DISPLAY DEVICE

(75) Inventor: Yuta Sugawara, Osaka (JP)

(73) Assignee: Panasonic Corporation, Osaka (JP)

( * ) Notice: Subject to any disclaimer, the term of this patent is extended or adjusted under 35 U.S.C. 154(b) by 31 days.

(21) Appl. No.: 13/455,375

(22) Filed: Apr. 25, 2012

(65) Prior Publication Data

US 2012/0206668 A1    Aug. 16, 2012

Related U.S. Application Data

(63) Continuation of application No. PCT/JP2011/000227, filed on Jan. 18, 2011.

(51) Int. Cl.
*H01L 21/00* (2006.01)
*H01L 21/36* (2006.01)

(52) U.S. Cl.
USPC ........... 438/158; 438/166; 438/487; 438/798; 250/492.2

(58) Field of Classification Search
USPC ............... 438/158, 166, 487, 798; 250/492.2; 257/E21.134, E21.414, E21.535
See application file for complete search history.

(56) References Cited

U.S. PATENT DOCUMENTS

| | | | | |
|---|---|---|---|---|
| 7,005,601 B2 * | 2/2006 | Jennings | | 219/121.66 |
| 8,035,100 B2 * | 10/2011 | Yoon et al. | | 257/43 |
| 2001/0011726 A1 * | 8/2001 | Hayashi et al. | | 257/59 |
| 2008/0070393 A1 * | 3/2008 | Miyairi et al. | | 438/585 |
| 2012/0161143 A1 | 6/2012 | Segawa | | |

FOREIGN PATENT DOCUMENTS

| | | |
|---|---|---|
| JP | 08-083766 | 3/1996 |
| JP | 10-242052 | 9/1998 |
| JP | 2007-035964 | 2/2007 |
| JP | 2007-220918 | 8/2007 |
| JP | 2010-287645 | 12/2010 |

OTHER PUBLICATIONS

U.S. Appl. No. 13/453,158 to Yuta Sugawara, filed Apr. 23, 2012.
U.S. Appl. No. 13/338,816 to Yuta Sugawara, filed Dec. 28, 2011.
U.S. Appl. No. 13/438,954 to Yuta Sugawara, filed Apr. 4, 2012.
International Search Report in PCT/JP2011/000227, dated Apr. 26, 2011.

* cited by examiner

*Primary Examiner* — Charles Garber
*Assistant Examiner* — Ron Pompey
(74) *Attorney, Agent, or Firm* — Greenblum & Bernstein, P.L.C.

(57) ABSTRACT

A thin-film transistor device manufacturing method forms a plurality of gate electrodes above a substrate. A silicon nitride layer is formed on the plurality of gate electrodes. A silicon oxide layer is formed on the silicon nitride layer. An amorphous silicon layer is formed on the silicon oxide layer. The amorphous silicon layer is crystallized using predetermined laser light to produce a crystalline silicon layer. A source electrode and a drain electrode are formed on the crystalline silicon layer in a region that corresponds to each of the plurality of gate electrodes. A film thickness of the silicon oxide layer, a film thickness of the silicon nitride layer, and a film thickness of the amorphous silicon layer satisfy predetermined conditional expressions.

15 Claims, 26 Drawing Sheets

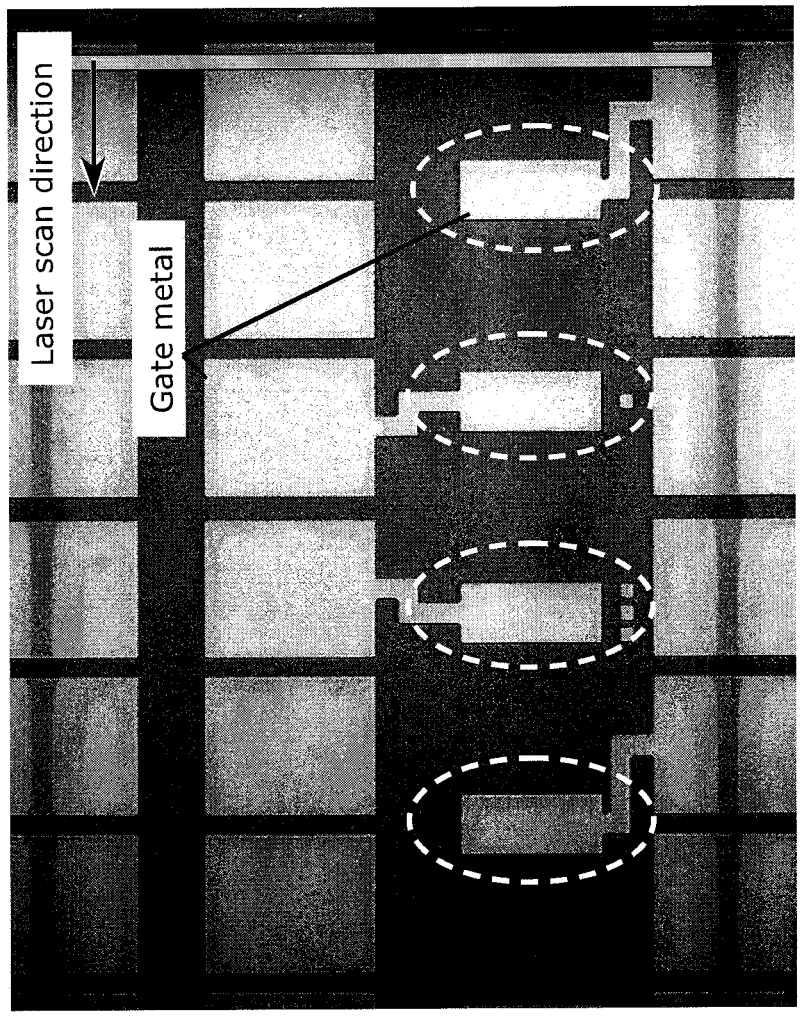
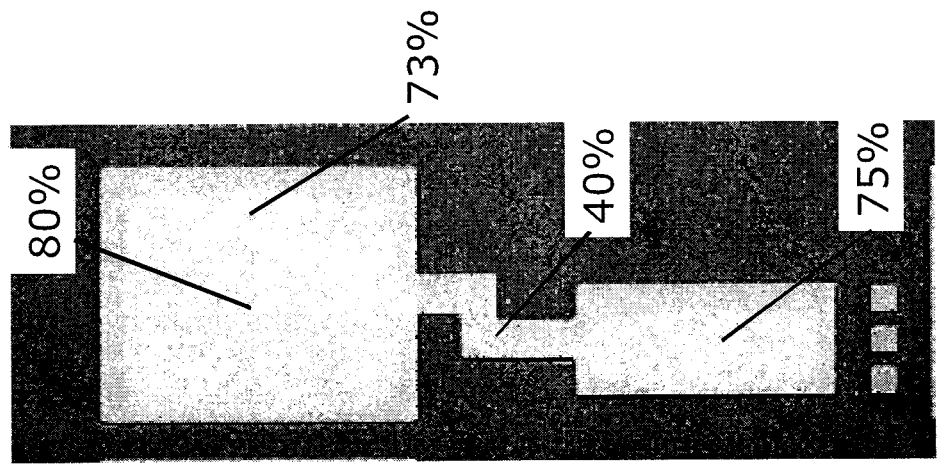
FIG. 1

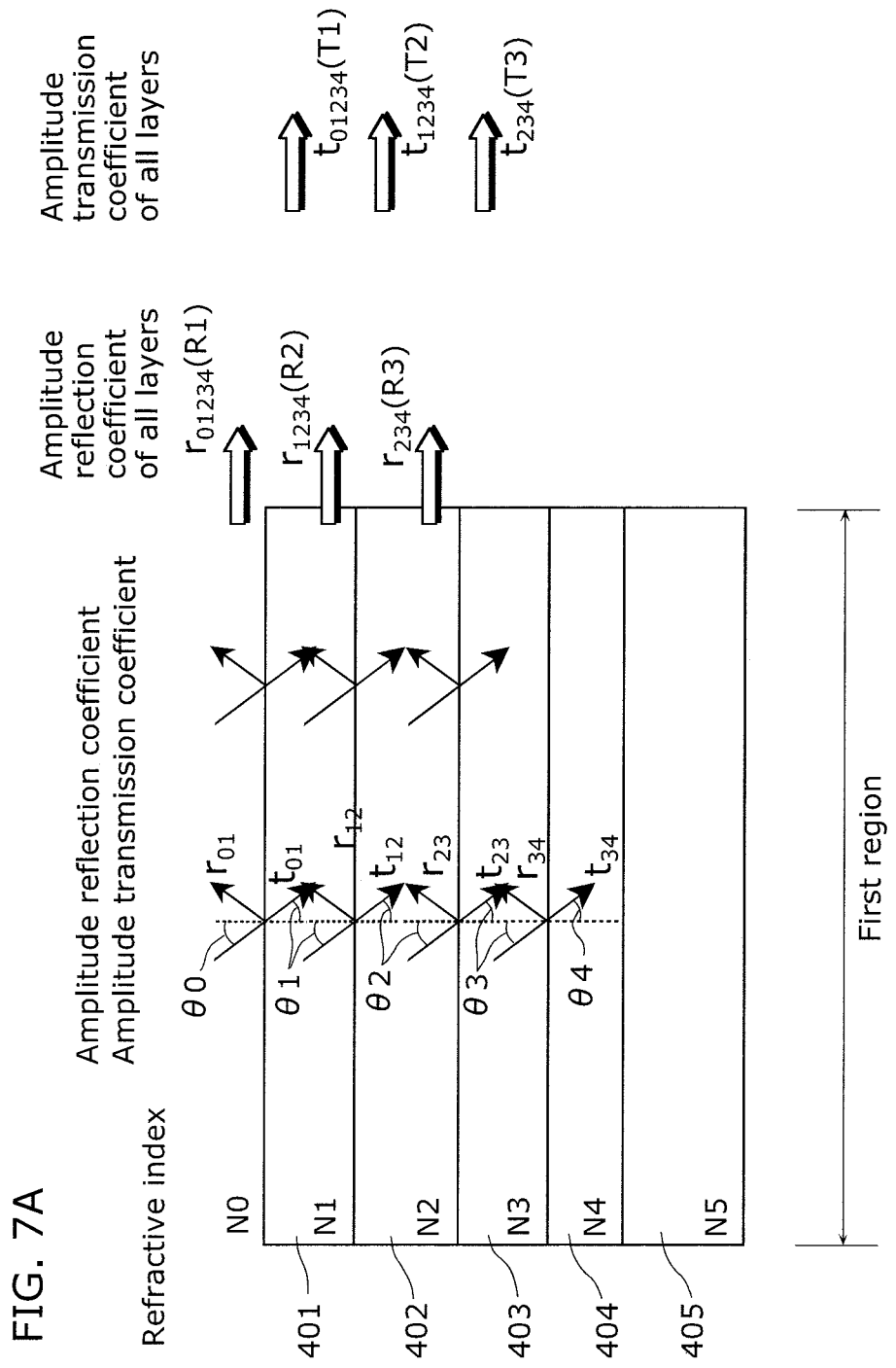

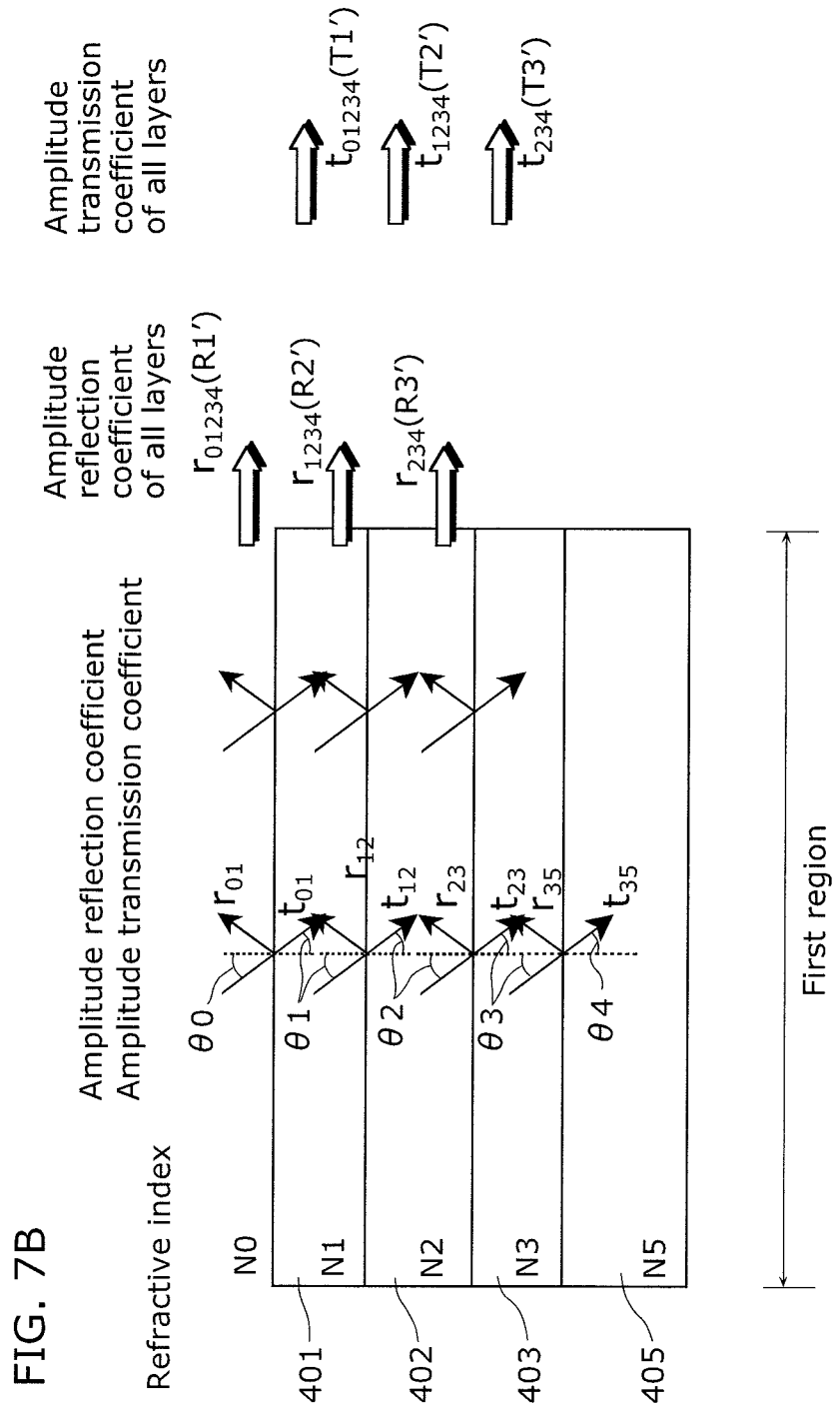

Optical film thickness obtained by converting stacked film of silicon oxide layer and silicon nitride layer by refractive index of silicon oxide layer/laser light wavelength $\lambda$
= Y

FIG. 9

| a-Si optical film thickness/λ | 0.238 | 0.286 | 0.334 | 0.382 | 0.429 | 0.477 | 0.525 |
|---|---|---|---|---|---|---|---|
| λ = 473 nm | 21 nm | 26 nm | 30 nm | 34 nm | 38 nm | 43 nm | 47 nm |
| λ = 532 nm | 25 nm | 30 nm | 35 nm | 40 nm | 45 nm | 50 nm | 55 nm |
| λ = 569 nm | 27 nm | 32 nm | 38 nm | 43 nm | 48 nm | 54 nm | 60 nm |

| c = 140 nm | c = 120 nm | c = 100 nm | SiO$_2$ converted optical film thickness/λ |
|---|---|---|---|
|  | 120.0/0.0 | 85.7/25.9 | 0.226 |
|  | 110.0/18.0 | 75.7/43.9 | 0.252 |
| 134.3/10.2 | 100.0/36.1 | 65.7/62.0 | 0.278 |
| 124.3/28.3 | 90.0/54.1<br>85.0/63.2 | 55.7/80.0 | 0.304<br>0.317 |
| 114.3/46.3 | 80.0/72.2 | 45.7/98.1 | 0.330 |
| 104.3/64.4 | 70.0/90.2 | 35.7/116.1 | 0.357 |
| 94.3/82.4 | 60.0/108.3 | 25.7/134.2 | 0.383 |
| 84.3/100.5 | 50.0/126.3 | 15.7/152.2 | 0.409 |
| 74.3/118.5 | 40.0/144.4 | 5.7/170.3 | 0.435 |
| 64.3/136.6 | 30.0/162.4 |  | 0.462 |

| c = 140 nm | c = 120 nm | c = 100 nm | SiO₂ converted optical film thickness/λ |
|---|---|---|---|
| | 115.3/8.5 | 80.9/34.5 | 0.226 |
| 139.1/1.6 | 104.7/27.6 | 70.3/53.6 | 0.252 |
| 128.5/20.8 | 94.1/46.8 | 59.7/72.8 | 0.278 |
| 117.9/39.9 | 83.5/65.9 | 49.1/91.9 | 0.304 |
| 107.3/59.0 | 72.9/85.0 | 38.5/111.0 | 0.330 |
| 96.7/78.1 | 62.3/104.1 | 72.9/130.1 | 0.357 |
| 86.1/97.3 | 51.7/123.3 | 17.3/149.3 | 0.383 |
| 75.5/116.4 | 41.1/142.4 | 6.7/168.4 | 0.409 |
| 64.9/135.5 | 30.5/161.5 | | 0.435 |
| 54.3/154.7 | 19.9/180.7 | | 0.462 |

FIG. 10C $\lambda$ = 473 nm

| c = 140 nm | c = 120 nm | c = 100 nm | SiO$_2$ converted optical film thickness/$\lambda$ |
|---|---|---|---|
|  | 120.0/0.0 | 95.2/8.6 | 0.226 |
|  | 110.0/18.0 | 86.4/24.6 | 0.252 |
|  | 111.8/14.8 | 77.5/40.6 | 0.278 |
| 137.2/5.0 | 102.9/30.8 | 68.6/56.6 | 0.304 |
| 128.3/21.0 | 94.10/46.8 | 59.8/72.6 | 0.330 |
| 119.5/37.0 | 85.2/62.8 | 50.9/88.6 | 0.357 |
| 110.6/53.0 | 76.3/78.8 | 42.1/104.6 | 0.383 |
| 101.8/69.0 | 67.5/94.8 | 33.2/120.6 | 0.409 |
| 92.9/85.0 | 58.6/110.8 | 24.3/136.5 | 0.435 |
| 84.0/101.0 | 49.8/126.8 | 15.5/152.5 | 0.462 |

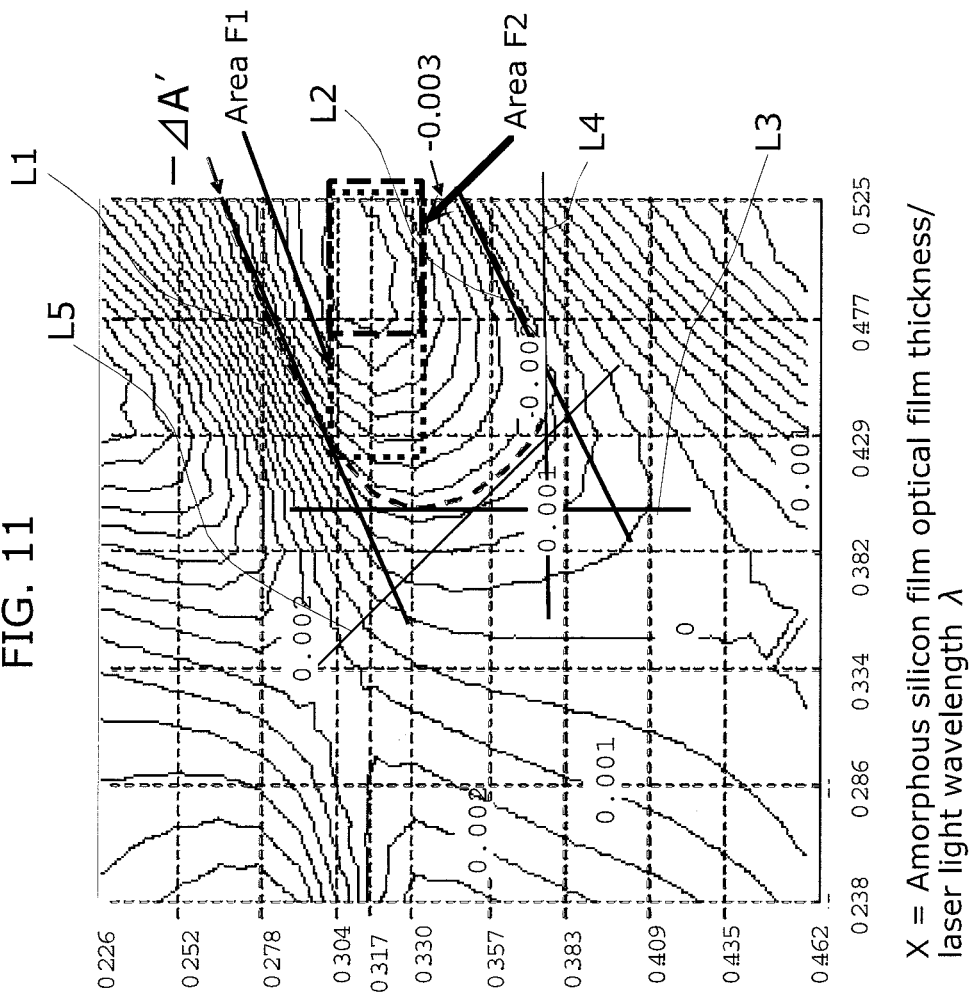

FIG. 16

| $\lambda = 532$ nm | Silicon oxide film thickness (nm)/ silicon nitride film thickness (nm) | | |
|---|---|---|---|
| $(n_{SiO} \cdot d_{SiO} + n_{SiN} \cdot d_{SiN})/n_{SiO}$ | c = 140 nm | c = 120 nm | c = 100 nm |
| 159.6 | 124.3/28.3 | 90.0/54.1 | 55.7/80.0 |
| 175.56 | 114.3/46.3 | 80.0/72.2 | 45.7/98.1 |

THIN-FILM TRANSISTOR DEVICE MANUFACTURING METHOD, THIN-FILM TRANSISTOR, AND DISPLAY DEVICE

CROSS REFERENCE TO RELATED APPLICATION

This is a continuation application of PCT Application No. PCT/JP2011/000227 filed on Jan. 18, 2011, designating the United States of America, the disclosure of which, including the specification, drawings and claims, is incorporated herein by reference in its entirety.

BACKGROUND OF THE INVENTION

1. Field of the Invention

The present invention relates to a thin-film transistor device manufacturing method, a thin-film transistor, and a display device.

2. Description of the Related Art

For example, a thin-film transistor (TFT) is included in a liquid crystal panel or an organic EL panel. A channel portion of the thin-film transistor is made of amorphous silicon a-Si, or polycrystalline silicon poly-Si which is a crystalline material. A crystalline silicon layer (poly-Si layer) of the channel portion of the thin-film transistor is typically produced by forming an amorphous silicon layer (a-Si layer) and then irradiating the amorphous silicon layer with laser light of an excimer laser or the like so that the amorphous silicon layer is instantly increased in temperature and crystallized.

There are two types of thin-film transistor structures, namely, a bottom-gate structure in which a gate metal is located on a substrate side as seen from x-Si (x is a or poly) of the channel portion, and a top-gate structure in which a gate metal and a source-drain metal are located on a side opposite to the substrate side as seen from x-Si of the channel portion. The bottom-gate structure is mainly used for a a-Si TFT whose channel portion is formed of an amorphous silicon layer, whereas the top-gate structure is mainly used for a poly-Si TFT whose channel portion is formed of a crystalline silicon layer. The bottom-gate structure is commonly used as a structure of thin-film transistors in a liquid crystal panel or an organic EL panel used for a large-area display device.

There is also an instance where the poly-Si TFT has the bottom-gate structure, which provides an advantage of a reduction in manufacturing cost. In the poly-Si TFT having the bottom-gate structure, the crystalline silicon layer is formed by irradiating an amorphous silicon layer with laser light to crystallize the amorphous silicon layer. In this method (laser annealing crystallization), the amorphous silicon layer is crystallized by heat generated by laser light irradiation.

Thin-film transistors in an organic EL panel are particularly required to have uniform characteristics. Applying the aforementioned laser annealing crystallization to manufacturing of the thin-film transistor of the bottom-gate structure, however, has the following drawback (problem). In the thin-film transistor of the bottom-gate structure, first a gate electrode is formed using a metal material of a higher heat conductivity than silicon or an insulation film, and then an insulation layer and an amorphous silicon layer are formed. Accordingly, when irradiating the amorphous silicon layer in the bottom-gate structure with laser light to crystallize the amorphous silicon layer by laser annealing crystallization, heat that is supposed to be used for crystallizing the amorphous silicon layer is absorbed and transmitted by the gate electrode, making it impossible to sufficiently crystallize the amorphous silicon layer. This causes decreased crystallinity or non-uniform crystallinity.

In view of such a problem, there is disclosed a method of disposing a dummy gate pattern in a nearby region of the gate electrode, i.e. a channel neighborhood, to reduce a difference in heat capacity between the amorphous silicon layer located above the gate electrode and the amorphous silicon layer located above the dummy gate pattern (for example, Patent Literature 1: Japanese Unexamined Patent Application Publication No. 10-242052). There is also disclosed a method of extending the gate electrode to a laser light scan upstream side so that, though the use of a pre-annealing effect of the extended portion of the gate electrode, the gate electrode is thermally saturated before laser light reaches the channel region of the thin-film transistor, thereby keeping the gate electrode from absorbing heat generated in the silicon thin film (for example, Patent Literature 2: Japanese Unexamined Patent Application Publication No. 2007-035964).

SUMMARY OF THE INVENTION

However, the aforementioned conventional methods have the following problems. In the methods disclosed in Patent Literatures 1 and 2, the electrode material is disposed near or in contact with the gate electrode, as a means of thermally saturating the gate electrode before laser light reaches the silicon thin film located above the gate electrode. Hence, there is a problem that it is difficult to densely arrange gate electrode patterns in the case of manufacturing a higher-resolution display device using thin-film transistors of the bottom-gate structure. Besides, the method disclosed in Patent Literature 2 has a constraint that thin-film transistors need to be arranged so that a channel direction of the thin-film transistors is constantly in parallel with a scan direction. This poses a serious problem in the case of manufacturing a higher-resolution display device, because design flexibility of circuit patterns in pixels of the display device is significantly reduced.

In the case where laser annealing crystallization is performed by scanning with a solid-state laser in a visible region, a problem different from the case where laser annealing crystallization is performed by scanning with an excimer laser arises. When performing laser annealing crystallization by scanning with the solid-state laser in the visible region, a heat diffusion length in the amorphous silicon layer becomes larger, which increases an influence of heat conduction by the gate electrode and results in insufficient crystallization. This is described below, with reference to FIG. 1. FIG. 1 is a diagram showing non-uniform crystallinity in the case where laser annealing crystallization is performed by scanning with the solid-state laser in the visible region.

As shown in the right part of FIG. 1, non-uniform crystallinity occurs on a scan upstream side (right in the drawing). The left part of FIG. 1 shows a crystallization rate of amorphous silicon above one of a plurality of gate metals shown in the right part of FIG. 1. In the left part of FIG. 1, for example, a crystallization rate of 80% indicates crystalline silicon of 30 nm to 40 nm in grain size, while a crystallization rate of 40% indicates crystalline silicon of 10 nm to 20 nm in grain size. Non-uniform crystallinity occurs in the case where crystallization is insufficient (not uniform), as shown in the left part of FIG. 1. Thus, crystallization is insufficient in the case where laser annealing crystallization is performed by scanning with the solid-state laser in the visible region. This causes problems such as degraded characteristics of manufactured thin-film transistors and non-uniform characteristics of individual transistors.

The present invention is made in view of the problems described above, and has an object of providing a thin-film transistor device manufacturing method, a thin-film transistor, and a display device using the thin-film transistor in which a crystalline silicon film of stable crystallinity can be formed using a laser of a wavelength in the visible region.

To achieve the stated object, a thin-film transistor device manufacturing method according to one aspect of the present invention includes: a first process of providing a substrate; a second process of forming a plurality of gate electrodes above the substrate; a third process of forming a silicon nitride layer on the plurality of gate electrodes; a fourth process of forming a silicon oxide layer on the silicon nitride layer; a fifth process of forming an amorphous silicon layer on the silicon oxide layer; a sixth process of crystallizing the amorphous silicon layer using laser light emitted from a predetermined laser of 473 nm to 561 nm in wavelength while moving the predetermined laser in a given direction relative to the substrate, to produce a crystalline silicon layer; and a seventh process of forming a source electrode and a drain electrode on the crystalline silicon layer in a region that corresponds to each of the plurality of gate electrodes, wherein a film thickness of the silicon oxide layer, a film thickness of the silicon nitride layer, and a film thickness of the amorphous silicon layer satisfy X and Y that are in ranges defined by Expressions 1 to 5:

$$Y \leq -0.198X + (0.343 - 10.83\Delta A'); \quad \text{Expression 1:}$$

$$Y \geq -0.236X + (0.481 - 8.83\Delta A'); \quad \text{Expression 2:}$$

$$X \geq 0.346 + C3 \text{ where } C3 = -36\Delta A' + 0.0007 \text{ when } 0 > \Delta A' > -0.0011 \text{ and } C3 = -18.636\Delta A' + 0.0198 \text{ when } -0.0011 \geq \Delta A'; \quad \text{Expression 3:}$$

$$Y \geq 0.435 + C4 \text{ where } C4 = 52\Delta A' - 0.0033 \text{ when } 0 > \Delta A' > -0.00104 \text{ and } C4 = 14.582\Delta A' - 0.0422 \text{ when } -0.00104 \geq \Delta A'; \text{ and} \quad \text{Expression 4:}$$

$$Y \geq (0.00053/(-\Delta A')^{1.18}) \times (X - 0.346) + 0.291 \text{ where } 0 > \Delta A', \quad \text{Expression 5:}$$

where X is a value obtained by dividing an optical film thickness of the amorphous silicon layer by the wavelength of the laser light, the optical film thickness of the amorphous silicon layer being a result of multiplying the film thickness of the amorphous silicon layer by a refractive index of the amorphous silicon layer, Y is a value obtained by dividing a silicon oxide layer converted optical film thickness by the wavelength of the laser light, the silicon oxide layer converted optical film thickness being a value obtained by dividing a sum of an optical film thickness of the silicon oxide layer and an optical film thickness of the silicon nitride layer by a refractive index of the silicon oxide layer, the optical film thickness of the silicon oxide layer being a result of multiplying the film thickness of the silicon oxide layer by the refractive index of the silicon oxide layer, and the optical film thickness of the silicon nitride layer being a result of multiplying the film thickness of the silicon nitride layer by a refractive index of the silicon nitride layer, and $\Delta A'$ is a value calculated according to an expression $(A_G/d_G) \times (\rho_{Si} \times c_{Si})/(\rho_G \times c_G)$, where $\rho_{Si}$ and $c_{Si}$ are respectively a density and a specific heat of the amorphous silicon layer, $d_G$, $\rho_G$, and $c_G$ are respectively a film thickness, a density, and a specific heat of the gate electrode, and $A_G$ is a maximum absorptance of the gate electrode when the amorphous silicon layer located above the gate electrode and the amorphous silicon layer not located above the gate electrode have an equal light absorptance for the laser light.

According to the present invention, it is possible to realize a thin-film transistor device manufacturing method, a thin-film transistor, and a display device using the thin-film transistor in which a crystalline silicon film of stable crystallinity can be formed using a laser of a wavelength in the visible region. In detail, it is possible to realize a thin-film transistor device manufacturing method, a thin-film transistor, and a display device using the thin-film transistor in which a crystalline silicon layer of stable crystallinity can be formed using a laser of a wavelength in the visible region by forming a silicon thin film and a gate insulation layer with respective film thicknesses that satisfy a predetermined condition, without a need for a particular change in thin-film transistor structure such as a gate electrode pattern shape.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 1 is a diagram showing non-uniform crystallinity in the case where laser annealing crystallization is performed by scanning with a solid-state laser in the visible region;

FIG. 7A is a diagram for describing a method of calculating an amplitude reflectance and an amplitude transmittance;

FIG. 7B is a diagram for describing the method of calculating an amplitude reflectance and an amplitude transmittance;

FIG. 9 is a diagram showing an example of a value obtained by converting a value in a horizontal axis in FIG. 8 to a film thickness of the amorphous silicon layer;

FIG. 10A is a diagram showing an example of a value obtained by converting a value in a vertical axis in FIG. 8 to film thicknesses of a silicon oxide layer and a silicon nitride layer that constitute the gate insulation layer;

FIG. 10B is a diagram showing an example of a value obtained by converting a value in the vertical axis in FIG. 8 to film thicknesses of the silicon oxide layer and the silicon nitride layer that constitute the gate insulation layer;

FIG. 10C is a diagram showing an example of a value obtained by converting a value in the vertical axis in FIG. 8 to film thicknesses of the silicon oxide layer and the silicon nitride layer that constitute the gate insulation layer;

FIG. 11 is a diagram used for calculating the appropriate film thickness ranges of the gate insulation layer and the amorphous silicon layer in FIG. 8;

FIG. 16 is a diagram showing an example of the film thickness of the silicon oxide layer and the film thickness of the silicon nitride layer in a more preferable area;

DESCRIPTION OF THE PREFERRED EMBODIMENT(S)

Figure 2:
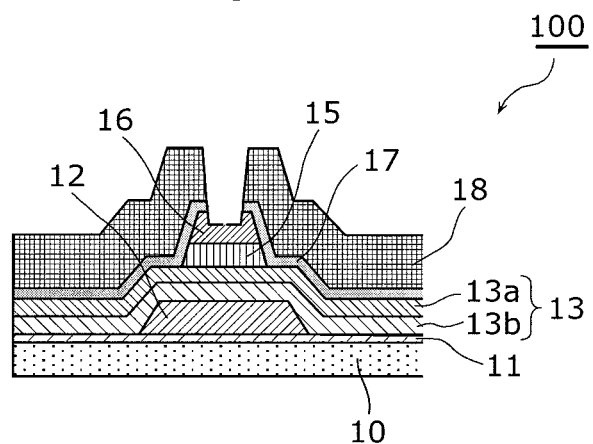
FIG. 2 is a cross-section diagram showing a structure of a thin-film transistor included in a display device in an embodiment of the present invention.

A thin-film transistor device manufacturing method according to a first aspect of the present invention includes: a first process of providing a substrate; a second process of forming a plurality of gate electrodes above the substrate; a third process of forming a silicon nitride layer on the plurality of gate electrodes; a fourth process of forming a silicon oxide layer on the silicon nitride layer; a fifth process of forming an amorphous silicon layer on the silicon oxide layer; a sixth process of crystallizing the amorphous silicon layer using laser light emitted from a predetermined laser of 473 nm to 561 nm in wavelength while moving the predetermined laser in a given direction relative to the substrate, to produce a crystalline silicon layer; and a seventh process of forming a source electrode and a drain electrode on the crystalline silicon layer in a region that corresponds to each of the plurality of gate electrodes, wherein a film thickness of the silicon oxide layer, a film thickness of the silicon nitride layer, and a film thickness of the amorphous silicon layer satisfy X and Y that are in ranges defined by Expressions 1 to 5:

$Y \leq -0.198X + (0.343 - 10.83\Delta A'')$; Expression 1:

$Y \geq -0.236X + (0.481 - 8.83\Delta A')$; Expression 2:

$X \geq 0.346 + C3$ where $C3 = -36\Delta A' + 0.0007$ when $0 > \Delta A' > -0.0011$ and $C3 = -18.636\Delta A' + 0.0198$ when $-0.0011 \geq \Delta A'$; Expression 3:

$Y \geq 0.435 + C4$ where $C4 = 52\Delta A' - 0.0033$ when $0 > \Delta A' > -0.00104$ and $C4 = 14.582\Delta A' - 0.0422$ when $-0.00104 \geq \Delta A'$; and Expression 4:

$Y \geq (0.00053/(-\Delta A')^{1.18}) \times (X - 0.346) + 0.291$ where $0 > \Delta A'$, Expression 5:

where X is a value obtained by dividing an optical film thickness of the amorphous silicon layer by the wavelength of the laser light, the optical film thickness of the amorphous silicon layer being a result of multiplying the film thickness of the amorphous silicon layer by a refractive index of the amorphous silicon layer, Y is a value obtained by dividing a silicon oxide layer converted optical film thickness by the wavelength of the laser light, the silicon oxide layer converted optical film thickness being a value obtained by dividing a sum of an optical film thickness of the silicon oxide layer and an optical film thickness of the silicon nitride layer by a refractive index of the silicon oxide layer, the optical film thickness of the silicon oxide layer being a result of multiplying the film thickness of the silicon oxide layer by the refractive index of the silicon oxide layer, and the optical film thickness of the silicon nitride layer being a result of multiplying the film thickness of the silicon nitride layer by a refractive index of the silicon nitride layer, and $\Delta A'$ is a value calculated according to an expression $(A_G/d_G) \times (\rho_{Si} \times c_{Si})/(\rho_G \times c_G)$, where $\rho_{Si}$ and $c_{Si}$ are respectively a density and a specific heat of the amorphous silicon layer, $d_G$, $\rho_G$, and $c_G$ are respectively a film thickness, a density, and a specific heat of the gate electrode, and $A_G$ is a maximum absorptance of the gate electrode when the amorphous silicon layer located above the gate electrode and the amorphous silicon layer not located above the gate electrode have an equal light absorptance for the laser light.

According to this aspect, the film thicknesses of the silicon nitride layer and the silicon oxide layer that serve as a gate insulation film and the film thickness of the amorphous silicon layer that serves as a channel layer satisfy the aforementioned condition, so that (1) the amorphous silicon layer not located above the gate electrode (hereafter referred to as the amorphous silicon layer in a second region) has a higher light absorptance than the amorphous silicon layer located above the gate electrode (hereafter referred to as the amorphous silicon layer in a first region), and also (2) the amorphous silicon layer located above the gate electrode has a higher heat generation temperature than a melting point of the amorphous silicon layer.

Owing to the advantageous effect (1), the amorphous silicon layer in the second region generates more heat than the amorphous silicon layer in the first region. Hence, heat generated in the amorphous silicon layer in the second region is transmitted to the gate electrode before the laser light emitted from the predetermined laser reaches a starting end of the gate electrode at which the irradiation with the laser light starts in the gate electrode, thereby thermally saturating the gate electrode.

As a result, from the starting end of the gate electrode at which the irradiation with the laser light starts to a terminating end of the gate electrode at which the irradiation with the laser light terminates in the gate electrode, a rate at which heat generated in the amorphous silicon layer in the first region is absorbed by the gate electrode can be reduced. This allows the amorphous silicon layer in the first region to have a substantially uniform heat generation temperature distribution. Thus, a substantially uniform crystal structure can be obtained in the crystalline silicon layer produced by crystallizing the amorphous silicon layer.

Moreover, owing to the advantageous effect (2), even in the case where the amorphous silicon layer in the second region has an excessively higher light absorptance than the amorphous silicon layer in the first region, that is, even in the case where the amorphous silicon layer in the second region generates excessively more heat than the amorphous silicon layer in the first region, the amorphous silicon in the first region and the second region melts to become molten silicon, as a result of which a heat conductivity of the amorphous silicon layer increases to a substantially same level as a heat conductivity of metal typically used as a gate electrode.

Accordingly, heat generated in the molten silicon layer in the second region is transmitted to the molten silicon layer in the first region, rather than being transmitted to the gate electrode via the silicon oxide layer and the silicon nitride layer. Since heat generated in the molten silicon layer in the second region is kept from being excessively transmitted to the gate electrode, there is no deterioration in heat generation temperature distribution of the gate electrode. Therefore, a decrease in uniformity of the heat generation temperature distribution of the amorphous silicon layer in the first region caused by the deterioration of the heat generation temperature distribution of the gate electrode can be prevented.

Thus, the combination of the advantageous effects (1) and (2) ensures a uniform crystal structure in the crystalline silicon layer produced by crystallizing the amorphous silicon layer. This makes it possible to realize a thin-film transistor device in which, from the crystalline silicon layer corresponding to the starting end of the gate electrode at which the irradiation with the laser light starts to the crystalline silicon layer corresponding to the terminating end of the gate electrode at which the irradiation with the laser light terminates in the gate electrode, a variation in crystallization rate in the crystalline silicon layer is suppressed.

A thin-film transistor device manufacturing method according to a second aspect of the present invention is the thin-film transistor device manufacturing method wherein, in the sixth process, the predetermined laser emits the laser light in an oscillation mode that is a continuous wave mode or a quasi-continuous wave mode.

A thin-film transistor device manufacturing method according to a third aspect of the present invention is the thin-film transistor device manufacturing method wherein the predetermined laser is included in a solid-state laser device.

A thin-film transistor device manufacturing method according to a fourth aspect of the present invention is the thin-film transistor device manufacturing method wherein the predetermined laser is included in a laser device that uses a semiconductor laser element.

A thin-film transistor device manufacturing method according to a fifth aspect of the present invention is the thin-film transistor device manufacturing method wherein, in the sixth process, a variation in irradiation energy density of the laser light on the amorphous silicon layer is approximately less than 5%.

A thin-film transistor device manufacturing method according to a sixth aspect of the present invention is the thin-film transistor device manufacturing method wherein, in the third process and the fourth process, the silicon nitride layer and the silicon oxide layer are formed with the respective film thicknesses so that a capacitance of a series capacitor composed of the silicon nitride layer and the silicon oxide layer is equal to a capacitance of a silicon oxide single layer of 100 nm to 140 nm in film thickness.

A thin-film transistor device manufacturing method according to a seventh aspect of the present invention is the thin-film transistor device manufacturing method wherein the film thickness of the silicon oxide layer, the film thickness of the silicon nitride layer, and the film thickness of the amorphous silicon layer satisfy X and Y that are in ranges defined by Expressions 6 and 7:

$$0.410 \leq X \leq 0.525; \text{ and} \qquad \text{Expression 6:}$$

$$0.300 \leq Y \leq 0.330. \qquad \text{Expression 7:}$$

According to this aspect, a gate breakdown voltage of the thin-film transistor can be enhanced without excessively increasing a fixed charge in the silicon nitride layer included in the gate insulation film. This keeps a threshold voltage of the thin-film transistor from being significantly shifted from 0 V. In addition, since the silicon nitride layer is limited to an adequate thickness, problems such as cracks, film peeling, and insufficient dehydrogenation caused by an increase in thickness of the silicon nitride layer can be suppressed. Hence, a productivity decline in thin-film transistor manufacturing can be avoided.

A thin-film transistor device manufacturing method according to an eighth aspect of the present invention is the thin-film transistor device manufacturing method wherein the wavelength of the predetermined laser is 532 nm.

A thin-film transistor device manufacturing method according to a ninth aspect of the present invention is the thin-film transistor device manufacturing method wherein the silicon oxide layer converted optical film thickness is in a range of 159.6 to 175.56.

A thin-film transistor device manufacturing method according to a tenth aspect of the present invention is the thin-film transistor device manufacturing method wherein the film thickness of the amorphous silicon layer is in a range of 55 nm to 60 nm.

According to these aspects, it is possible to realize a thin-film transistor in which a variation in crystallization rate in the crystalline silicon layer is suppressed, even when the film thicknesses of the silicon nitride layer, the silicon oxide layer, and the amorphous silicon layer in the thin-film transistor change from their target film thicknesses by 10%.

A thin-film transistor device manufacturing method according to an eleventh aspect of the present invention is the thin-film transistor device manufacturing method wherein the second process includes: forming an undercoat layer made of silicon oxide, on the substrate; and forming the plurality of gate electrodes on the undercoat layer.

A thin-film transistor according to a twelfth aspect of the present invention includes: a substrate; a plurality of gate electrodes formed above the substrate; a silicon nitride layer formed on the plurality of gate electrodes; a silicon oxide layer formed on the silicon nitride layer; a crystalline silicon layer formed on the silicon oxide layer; and a source electrode and a drain electrode formed on the crystalline silicon layer in a region that corresponds to each of the plurality of gate electrodes, wherein the crystalline silicon layer is produced by forming an amorphous silicon layer on the silicon oxide layer and then crystallizing the amorphous silicon layer using laser light emitted from a predetermined laser while moving the predetermined laser in a given direction relative to the substrate, and a film thickness of the silicon oxide layer, a film thickness of the silicon nitride layer, and a film thickness of the amorphous silicon layer satisfy X and Y that are in ranges defined by Expressions 1 to 5:

$Y \leq -0.198X + (0.343 - 10.83\Delta A')$;  Expression 1:

$Y \geq -0.236X + (0.481 - 8.83\Delta A')$;  Expression 2:

$X \geq 0.346 + C3$ where $C3 = -36\Delta A' + 0.0007$ when $0 > \Delta A' > -0.0011$ and $C3 = -18.636\Delta A' + 0.0198$ when $-0.0011 \geq \Delta A'$;  Expression 3:

$Y \geq 0.435 + C4$ where $C4 = 52\Delta A' - 0.0033$ when $0 > \Delta A' > -0.00104$ and $C4 = 14.582\Delta A' - 0.0422$ when $-0.00104 \geq \Delta A'$; and  Expression 4:

$Y \geq (0.00053/(-\Delta A')^{1.18}) \times (X - 0.346) + 0.291$ where $0 > \Delta A'$,  Expression 5:

where X is a value obtained by dividing an optical film thickness of the amorphous silicon layer by the wavelength of the laser light, the optical film thickness of the amorphous silicon layer being a result of multiplying the film thickness of the amorphous silicon layer by a refractive index of the amorphous silicon layer, Y is a value obtained by dividing a silicon oxide layer converted optical film thickness by the wavelength of the laser light, the silicon oxide layer converted optical film thickness being a value obtained by dividing a sum of an optical film thickness of the silicon oxide layer and an optical film thickness of the silicon nitride layer by a refractive index of the silicon oxide layer, the optical film thickness of the silicon oxide layer being a result of multiplying the film thickness of the silicon oxide layer by the refractive index of the silicon oxide layer, and the optical film thickness of the silicon nitride layer being a result of multiplying the film thickness of the silicon nitride layer by a refractive index of the silicon nitride layer, and $\Delta A'$ is a value calculated according to an expression $(A_G/d_G) \times (\rho_{Si} \times c_{Si})/(\rho_G \times c_G)$, where $\rho_{Si}$ and $c_{Si}$ are respectively a density and a specific heat of the amorphous silicon layer, $d_G$, $\rho_G$, and $c_G$ are respectively a film thickness, a density, and a specific heat of the gate electrode, and $A_G$ is a maximum absorptance of the gate electrode when the amorphous silicon layer located above the gate electrode and the amorphous silicon layer not located above the gate electrode have an equal light absorptance for the laser light.

A display device according to a thirteenth aspect of the present invention is a display device including a liquid crystal panel or an EL panel, the display device including the thin-film transistor according to the twelfth aspect, wherein the thin-film transistor drives the liquid crystal panel or the EL panel.

A display device according to a fourteenth aspect of the present invention is the display device wherein the EL panel is an organic EL panel.

A thin-film transistor device manufacturing method according to a fifteenth aspect of the present invention includes: a first process of providing a substrate; a second process of forming a plurality of gate electrodes above the substrate; a third process of forming a silicon nitride layer on the plurality of gate electrodes; a fourth process of forming a silicon oxide layer on the silicon nitride layer; a fifth process of forming an amorphous silicon layer on the silicon oxide layer; a sixth process of crystallizing the amorphous silicon layer using laser light emitted from a predetermined laser of 473 nm to 561 nm in wavelength while moving the predetermined laser in a given direction relative to the substrate, to produce a crystalline silicon layer; and a seventh process of forming a source electrode and a drain electrode on the crystalline silicon layer in a region that corresponds to each of the plurality of gate electrodes, wherein the second process, the third process, the fourth process, and the fifth process are performed so that, in the sixth process, when the amorphous silicon layer is irradiated with the laser light, a maximum reached temperature of the amorphous silicon layer in a region not located above the gate electrode is higher than a maximum reached temperature of the amorphous silicon layer in a region located above the gate electrode and also the amorphous silicon layer in the region located above the gate electrode has a substantially uniform maximum reached temperature, the region not located above the gate electrode being upstream in the direction of the relative movement of the predetermined laser.

A thin-film transistor device manufacturing method according to a sixteenth aspect of the present invention is the thin-film transistor device manufacturing method wherein in the second process, the third process, the fourth process, and the fifth process, the gate electrode, the silicon nitride layer, the silicon oxide layer, and the amorphous silicon layer are formed with respective film thicknesses so that, in the sixth process, when the amorphous silicon layer is irradiated with the laser light, the maximum reached temperature of the amorphous silicon layer in the region not located above the gate electrode is higher than the maximum reached temperature of the amorphous silicon layer in the region located above the gate electrode and also the amorphous silicon layer in the region located above the gate electrode has the substantially uniform maximum reached temperature, the region not located above the gate electrode being upstream in the direction of the relative movement of the predetermined laser.

A thin-film transistor device manufacturing method according to a seventeenth aspect of the present invention includes: a first process of providing a substrate; a second process of forming a gate electrode above the substrate; a third process of forming a silicon nitride layer on the gate electrode; a fourth process of forming a silicon oxide layer on the silicon nitride layer; a fifth process of forming a semiconductor material layer that includes a semiconductor material, on the silicon oxide layer; a sixth process of crystallizing the semiconductor material by irradiating the semiconductor material layer with predetermined laser light of 473 nm to 561 nm in wavelength, to produce a semiconductor layer; and a seventh process of forming a source electrode and a drain electrode on the semiconductor layer in a second region that does not correspond to the gate electrode, the second region being different from a first region that corresponds to the gate electrode, wherein the second process, the third process, the fourth process, and the fifth process are performed so that a heating value of the semiconductor material layer in the second region per unit volume is higher than a heating value of the semiconductor material layer in the first region per unit volume, and in the sixth process, heat generated in the semiconductor material layer in the first region by the irradiation with the predetermined laser light and transmitted to and absorbed by the gate electrode is accumulated in the gate electrode without being diffused into the semiconductor material layer in the second region, and a part having a uniform temperature distribution is formed in the semiconductor material layer in the first region generating the heat, to crystallize the semiconductor material.

A thin-film transistor device manufacturing method according to an eighteenth aspect of the present invention is the thin-film transistor device manufacturing method wherein in the second process, the third process, the fourth process, and the fifth process, the gate electrode, the silicon nitride layer, the silicon oxide layer, and the semiconductor material layer are formed with respective film thicknesses so that the heating value of the semiconductor material layer in the second region per unit volume is higher than the heating value of the semiconductor material layer in the first region per unit volume.

A thin-film transistor device manufacturing method according to a nineteenth aspect of the present invention is the thin-film transistor device manufacturing method wherein the second region of the semiconductor material layer is a region upstream and downstream of the first region of the semiconductor material layer, in a direction in which the predetermined laser light is moved relative to the substrate in the sixth process.

A thin-film transistor device manufacturing method according to a twentieth aspect of the present invention is the thin-film transistor device manufacturing method wherein the second process, the third process, the fourth process, and the fifth process are performed so that, in the sixth process, a difference between the heating value of the semiconductor material layer in the second region per unit volume and the heating value of the semiconductor material layer in the first region per unit volume is equal to or more than a heating value of the gate electrode per unit volume.

A thin-film transistor device manufacturing method according to a twenty-first aspect of the present invention is the thin-film transistor device manufacturing method wherein the second process, the third process, the fourth process, and the fifth process are performed so that, in the sixth process, the part having the uniform temperature distribution is formed in the semiconductor material layer in the first region at a ratio of 0.8 to 1.0 in size to the first region.

The following describes an embodiment of the present invention with reference to drawings.

FIG. 2 is a cross-section diagram showing a structure of a thin-film transistor included in an organic light-emitting display device in the embodiment of the present invention.

A thin-film transistor 100 shown in FIG. 2 is a thin-film transistor of the bottom-gate structure, and includes a substrate 10, an undercoat layer 11, a gate electrode 12, a gate insulation layer 13, a crystalline silicon layer 15, an amorphous silicon layer 16, a n+ silicon layer 17, and source and drain electrodes 18.

The substrate 10 is an insulation substrate made of, for example, transparent glass or quartz.

The undercoat layer 11 is formed on the substrate 10, and made of, for example, a silicon nitride (SiNx) layer, a silicon oxide (SiOx) layer, or a stacked structure of a silicon nitride layer and a silicon oxide layer. It is preferable that the undercoat layer 11 is made of silicon oxide (SiOx) where 1.5<x<2.0, with a film thickness of 300 nm to 1500 nm. A more preferable film thickness range of the undercoat layer 11 is 500 nm to 1000 nm. When the undercoat layer 11 is thick, a heat load on the substrate 10 can be reduced. When the undercoat layer 11 is excessively thick, however, film peeling or cracks occur.

The gate electrode 12 is formed on the undercoat layer 11, and typically made of a metal material such as molybdenum (Mo) or a Mo alloy (e.g. MoW (molybdenum-tungsten alloy)). The gate electrode 12 is made of any metal capable of withstanding a melting point of silicon. Accordingly, the gate electrode 12 may be made of an alloy of W (tungsten), Ta (tantalum), Nb (niobium), Ni (Nickel), Cr (chromium), Mo, and the like. The gate electrode 12 preferably has a film thickness of 30 nm to 300 nm, and more preferably has a film thickness of 50 nm to 100 nm. When the gate electrode 12 is thin, a transmittance of the gate electrode 12 increases, which tends to induce a decrease in reflection of laser light described later. When the gate electrode 12 is thick, on the other hand, the gate insulation layer 13 described later has a poor coverage, which tends to induce degradation in characteristics of the thin-film transistor 100. In particular, a break in the gate insulation film at a step portion at an end of the gate electrode 12 causes the gate electrode 12 and the n+ silicon layer 17 to be electrically continuous with each other.

The gate insulation layer 13 is formed so as to cover the gate electrode 12, and made of, for example, a silicon oxide layer or a stacked structure of a silicon oxide layer and a silicon nitride layer. The following description is based on an assumption that the gate insulation layer 13 is made of a stacked structure of a silicon oxide layer 13a and a silicon nitride layer 13b, where the silicon nitride layer 13b and the silicon oxide layer 13a are formed on the gate electrode 12 in this order.

For example, the gate insulation layer 13 is formed with a film thickness so as to have a substantially same capacitance as a capacitance of the silicon oxide layer 13a when the silicon oxide layer 13a is 100 nm to 140 nm in film thickness. That is, there is an appropriate range of the film thickness of the gate insulation layer 13 in the case of forming the crystalline silicon layer 15 by laser annealing crystallization. This appropriate range is defined by predetermined relational expressions. The predetermined relational expressions will be described in detail later.

The crystalline silicon layer 15 is formed on the gate insulation layer 13, and made of a polycrystalline silicon layer (poly-Si layer). The crystalline silicon layer 15 is produced by forming an amorphous silicon layer 14 (not shown) made of a-Si on the gate insulation layer 13 and then irradiating the amorphous silicon layer 14 with laser light to change the amorphous silicon layer 14 into polycrystalline form (including microcrystalline form).

Polycrystalline mentioned here has a broad meaning that includes not only a polycrystalline structure which is narrowly interpreted as being made up of crystals of 50 nm or more, but also a microcrystalline structure which is narrowly interpreted as being made up of crystals of 50 nm or less. The broad meaning of polycrystalline is hereafter adopted.

A laser light source used for laser irradiation is a laser of a wavelength in a visible region. The laser of the wavelength in the visible region is a laser of approximately 380 nm to 780 nm in wavelength, preferably a green laser of 473 nm to 561 nm in wavelength, and more preferably a green laser of 532 nm in wavelength. The laser of the wavelength in the visible region has an oscillation mode that is a continuous wave mode or a quasi-continuous wave mode. In the case where the laser of the wavelength in the visible region has a pulse oscillation mode other than the continuous wave mode or the quasi-continuous wave mode, the amorphous silicon layer 14 is discontinuously irradiated with laser light, making it impossible to constantly maintain the amorphous silicon layer 14 in a molten state. Here, the quasi-continuous wave mode is included because the molten state can be maintained by applying a pulse to the amorphous silicon layer 14 for reheating before the amorphous silicon layer 14 is cooled to its melting point or below. That is, the quasi-continuous wave mode is preferably used in such a manner that a pulse is applied to the amorphous silicon layer 14 for reheating before the amorphous silicon layer 14 is cooled to its melting point or below, thereby maintaining the molten state of the amorphous silicon layer 14. Moreover, the laser of the wavelength in the visible region may be a solid-state laser device, or a laser device that uses a semiconductor laser element. Any of these devices is preferable because laser light can be controlled accurately. It is also preferable that a variation in irradiation energy density of the laser of the wavelength in the visible region on the amorphous silicon layer 14 is approximately less than 5%, in order to form the crystalline silicon layer 15 of uniform crystallinity. By forming the crystalline silicon layer 15 of uniform crystallinity, original design characteristics of the thin-film transistor can be attained, and also uniform characteristics can be achieved.

The amorphous silicon layer 14 is made of amorphous silicon a-Si, and formed on the gate insulation layer 13. The amorphous silicon layer 14 preferably has a film thickness of 20 nm to 60 nm, and more preferably has a film thickness of 55 nm to 60 nm. That is, there is an appropriate range of the film thickness of the amorphous silicon layer 14 in the case of forming the crystalline silicon layer 15 by laser annealing crystallization. This appropriate range is defined by predetermined relational expressions, based on a technical idea described later. The following description is based on an assumption that the gate insulation layer 13 is made of the stacked structure of the silicon oxide layer 13a and the silicon nitride layer 13b, as noted earlier.

In detail, variables for representing the relational expressions are defined first. Let X be a value obtained by dividing an optical film thickness of the amorphous silicon layer 14 by the wavelength of the laser light, where the optical film thickness of the amorphous silicon layer 14 is a result of multiplying the film thickness of the amorphous silicon layer 14 by a refractive index of the amorphous silicon layer 14. Let Y be a value obtained by dividing a silicon oxide layer converted optical film thickness by the wavelength of the laser light, where the silicon oxide layer converted optical film thickness is a value obtained by dividing a sum of an optical film thickness of the silicon oxide layer 13a and an optical film thickness of the silicon nitride layer 13b by a refractive index of the silicon oxide layer 13a, the optical film thickness of the silicon oxide layer 13a being a result of multiplying the film thickness of the silicon oxide layer 13a by the refractive index of the silicon oxide layer 13a, and the optical film thickness of the silicon nitride layer 13b being a result of multiplying the film thickness of the silicon nitride layer 13b by a refractive index of the silicon nitride layer 13b.

Moreover, let $\rho_{Si}$ and $c_{Si}$ be respectively a density and a specific heat of the amorphous silicon layer 14, and $d_G$, $\rho_G$, and $c_G$ be respectively the film thickness, a density, and a specific heat of the gate electrode 12. Further, let $A_G$ be a maximum absorptance of the gate electrode 12 when the amorphous silicon layer 14 located above the gate electrode 12 (i.e. in the first region) and the amorphous silicon layer 14 not located above the gate electrode 12 (i.e. in the second region) have an equal light absorptance for the laser light. Let $\Delta A'$ be a value calculated according to an expression $(A_G/d_G) \times (\rho_{Si} \times c_{Si})/(\rho_G \times c_G)$.

This being so, the appropriate range of the film thickness of the gate insulation layer 13 and the appropriate range of the film thickness of the amorphous silicon layer 14 are determined using X, Y, and $\Delta A'$ defined above. In detail, it is preferable that the film thickness of the silicon oxide layer 13a, the film thickness of the silicon nitride layer 13b, and the film thickness of the amorphous silicon layer 14 satisfy X and Y that are in ranges defined by the following (Expression 1) to (Expression 5).

$$Y \leq -0.198X + (0.343 - 10.83\Delta A') \quad \text{(Expression 1)}$$

$$Y \geq -0.236X + (0.481 - 8.83\Delta A') \quad \text{(Expression 2)}$$

$$X \geq 0.346 + C3 \text{ where } C3 = -36\Delta A' + 0.0007 (0 > \Delta A' > -0.0011) \text{ and } C3 = -18.636\Delta A' + 0.0198 (-0.0011 \geq \Delta A') \quad \text{(Expression 3)}$$

$$Y \geq 0.435 + C4 \text{ where } C4 = 52\Delta A' - 0.0033 (0 > \Delta A' > -0.00104) \text{ and } C4 = 14.582\Delta A' - 0.0422 (-0.00104 \geq \Delta A') \quad \text{(Expression 4)}$$

$$Y \geq (0.00053/(-\Delta A')^{1.18}) \times (X - 0.346) + 0.291 (0 > \Delta A') \quad \text{(Expression 5)}$$

An example of more preferable numerical ranges of X and Y defined above is given below. In detail, it is more preferable that the film thickness of the silicon oxide layer 13a, the film thickness of the silicon nitride layer 13b, and the film thickness of the amorphous silicon layer 14 satisfy X and Y that are in ranges defined by the following (Expression 6) and (Expression 7).

$$0.410 \leq X \leq 0.525 \quad \text{(Expression 6)}$$

$$0.300 \leq Y \leq 0.330 \quad \text{(Expression 7)}$$

In the case of the green laser that emits laser light of 532 nm in wavelength, a more preferable range of the film thickness of the gate insulation layer 13 is determined as follows. In detail, it is preferable to form the gate insulation layer 13 with the film thickness so that the silicon oxide layer converted optical film thickness is in a range of 159.6 to 175.56.

The amorphous silicon layer 16 is formed on the crystalline silicon layer 15. Thus, the thin-film transistor 100 has a channel layer of a structure in which the amorphous silicon layer 16 is formed on the crystalline silicon layer 15.

The n+ silicon layer 17 is formed so as to cover the gate insulation layer 13 and side surfaces of the amorphous silicon layer 16 and the crystalline silicon layer 15.

The source and drain electrodes 18 are formed on the n+ silicon layer 17, and made of, for example, a metal material including: metal such as Mo or an Mo alloy; metal such as titanium (Ti) or aluminum (Al), or an Al alloy; metal such as copper (Cu) or a Cu alloy; or metal such as silver (Ag), chromium (Cr), tantalum (Ta), tungsten (W), or the like.

The thin-film transistor 100 has the structure described above.

Figure 3:
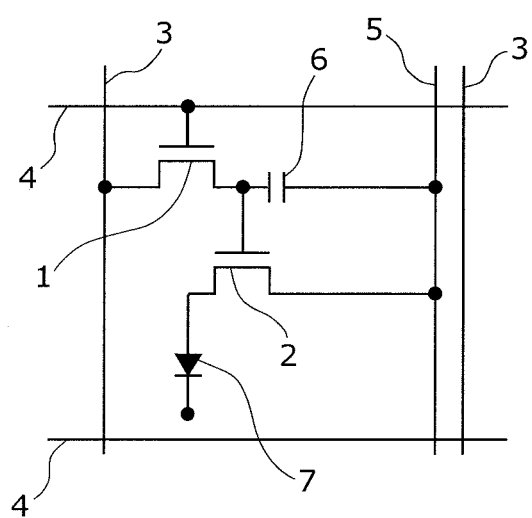
FIG. 3 is a diagram showing an equivalent circuit of the display device in the embodiment of the present invention.

FIG. 3 is a diagram showing an equivalent circuit of the display device in the embodiment of the present invention.

The organic light-emitting display device shown in FIG. 3 includes a switching transistor 1, a drive transistor 2, a data line 3, a scan line 4, a current supply line 5, a capacitor 6, and an organic EL element 7.

The switching transistor 1 is connected to the data line 3, the scan line 4, and the capacitor 6.

The drive transistor 2 corresponds to, for example, the thin-film transistor 100 shown in FIG. 2, and is connected to the current supply line 5, the capacitor 6, and the organic EL element 7.

The data line 3 is a wire through which data (a magnitude of a voltage) for determining brightness of a pixel of the organic EL element 7 is transmitted to the pixel of the organic EL element 7.

The scan line 4 is a wire through which data for determining switching (ON/OFF) of the pixel of the organic EL element 7 is transmitted to the pixel of the organic EL element 7.

The current supply line 5 is a wire for supplying a large current to the drive transistor 2.

The capacitor 6 holds a voltage value (charge) for a fixed time.

The organic light-emitting display device has the structure described above.

The following describes a manufacturing method of the aforementioned thin-film transistor 100.

Figure 4:
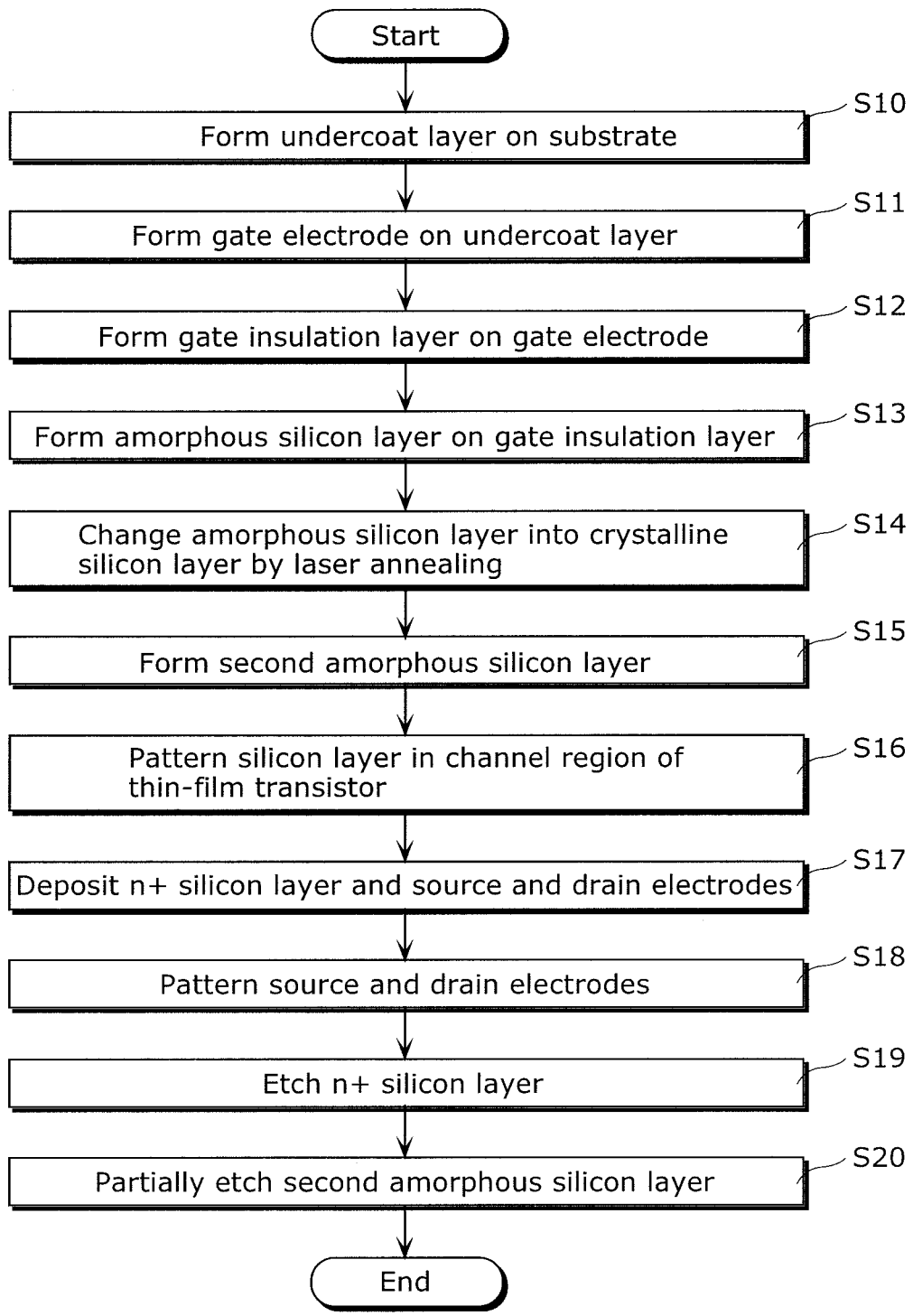
FIG. 4 is a flowchart showing a manufacturing process of the thin-film transistor in the display device in the embodiment of the present invention.
Figure 5A:
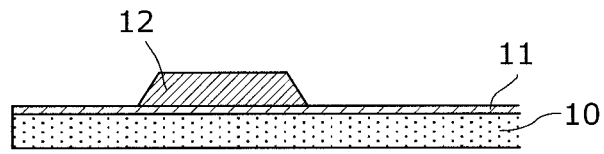
FIG. 5A is a cross-section diagram for describing a manufacturing method of the thin-film transistor in the display device in the embodiment of the present invention.

FIG. 4 is a flowchart showing a manufacturing process of the thin-film transistor in the organic light-emitting display device in the embodiment of the present invention. Though a plurality of thin-film transistors 100 are manufactured at the same time, the following describes a method of manufacturing one thin-film transistor for simplicity's sake. FIGS. 5A to 5J are diagrams for describing the manufacturing method of the thin-film transistor in the organic light-emitting display device in the embodiment of the present invention. FIG. 6 is a diagram schematically showing laser annealing in Step S14 in FIG. 4.

First, the substrate 10 is provided, and the undercoat layer 11 is formed on the substrate 10 (Step S10). Next, the gate electrode 12 is formed on the undercoat layer 11 (Step S11).

In detail, the undercoat layer 11 is deposited on the substrate 10 by plasma CVD (Chemical Vapor Deposition). Following this, a metal film for the gate electrode 12 is deposited by sputtering, and photolithography and etching are performed to form the gate electrode 12 in the thin-film transistor 100 (FIG. 5A). Here, the gate electrode 12 is typically made of a metal material such as Mo or a Mo alloy (e.g. MoW (molybdenum-tungsten alloy)).

Next, the gate insulation layer 13 is formed on the gate electrode 12 (Step S12). After this, the amorphous silicon layer 14 is formed on the gate insulation layer 13 (Step S13).

Figure 5B:
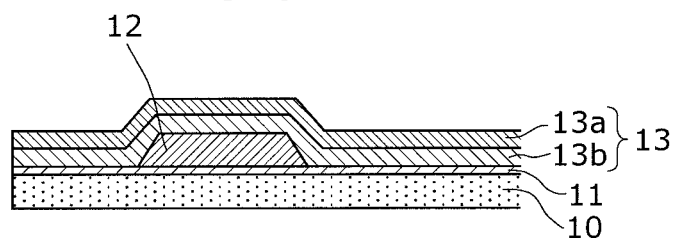
FIG. 5B is a cross-section diagram for describing the manufacturing method of the thin-film transistor in the display device in the embodiment of the present invention.
Figure 5C:
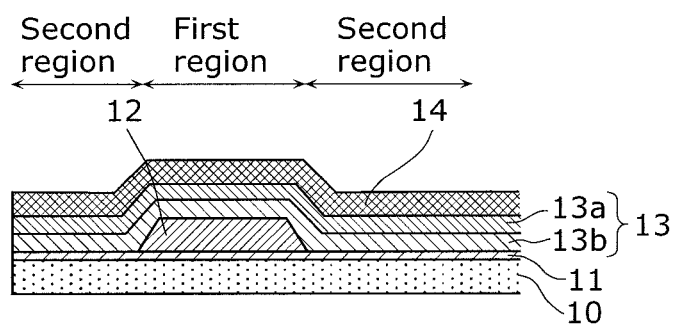
FIG. 5C is a cross-section diagram for describing the manufacturing method of the thin-film transistor in the display device in the embodiment of the present invention.
Figure 6:
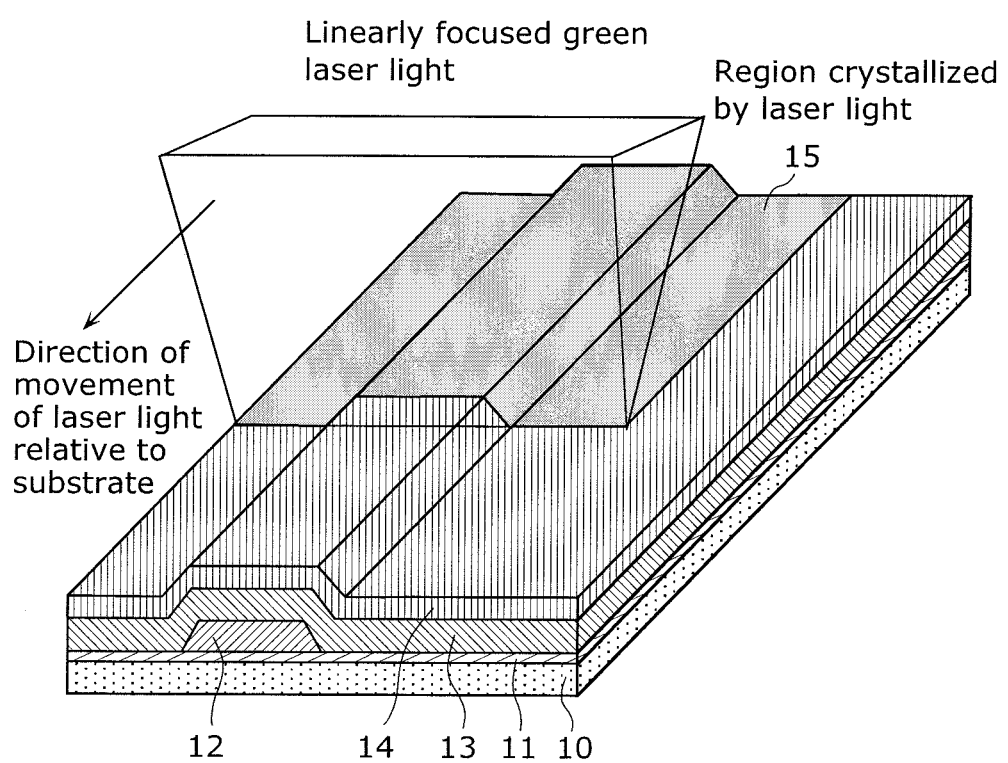
FIG. 6 is a diagram schematically showing laser annealing in Step S14 in FIG. 4.

In detail, by plasma CVD, the silicon nitride layer 13b is formed on the gate electrode 12 so as to cover the undercoat layer 11 and the gate electrode 12, and the silicon oxide layer 13a is formed on the silicon nitride layer 13b to thereby form the gate insulation layer 13 (FIG. 5B). The amorphous silicon layer 14 is continuously deposited on the deposited gate insulation layer 13 (FIG. 5C).

For example, the gate insulation layer 13 is formed with the film thickness so as to have a substantially same capacitance as a capacitance of the silicon oxide layer 13a of 100 nm to 140 nm in film thickness. The film thickness of the amorphous silicon layer 14 is 20 nm to 60 nm as an example, and preferably 55 nm to 60 nm. In detail, it is preferable that the film thickness of the silicon oxide layer 13a, the film thickness of the silicon nitride layer 13b, and the film thickness of the amorphous silicon layer 14 satisfy X and Y that are in the ranges defined by (Expression 1) to (Expression 5), as mentioned above. In more detail, let $A_{Si1}$ be the laser light absorptance of the amorphous silicon layer 14 located above the region where the gate electrode 12 is formed (i.e. in the first region), and $A_{Si1}'$ be a normalized absorptance obtained by dividing the absorptance $A_{Si2}$ by the film thickness $d_{Si}$ of the amorphous silicon layer 14. Let $A_{Si2}$ be the laser light absorptance of the amorphous silicon layer 14 located above the region where the gate electrode 12 is not formed (i.e. in the second region), and $A_{Si2}'$ be a normalized absorptance obtained by dividing the absorptance $A_{Si2}$ by the film thickness $d_{Si}$ of the amorphous silicon layer 14. This being the case, a difference $A_{Si1}'-A_{Si2}'$ is equal to or less than a value $-\Delta A'$ defined in the following description. In other words, the gate insulation layer 13 and the amorphous silicon layer 14 having the respective film thicknesses that satisfy a relational expression of (Expression 8) are formed in Steps S12 and S13.

$$A_{Si1}'-A_{Si2}' \leq -\Delta A' \qquad \text{(Expression 8)}$$

Though detailed description will be given later, these absorptances of the amorphous silicon layer 14 are derived from optical calculation using, as parameters, the film thickness and an optical constant of the amorphous silicon layer 14, the structure, the film thickness, and an optical constant of the gate insulation layer 13, an optical constant of the metal material forming the underlying gate electrode 12, and an optical constant of the substrate 10, while taking multiple interference of the laser light into consideration.

Next, the amorphous silicon layer 14 is changed into the crystalline silicon layer 15 by laser annealing (Step S14). In detail, while moving a predetermined laser in a given direction relative to the substrate 10, the amorphous silicon layer 14 is crystallized using laser light emitted from the predetermined laser, to produce the crystalline silicon layer 15. In more detail, first, dehydrogenation is performed on the formed amorphous silicon layer 14. After this, the amorphous silicon layer 14 is changed into polycrystalline form (including microcrystalline form) by laser annealing, as a result of which the crystalline silicon layer 15 is formed (FIG. 5D).

The laser light source used for laser irradiation in this laser annealing is the laser of the wavelength in the visible region, as mentioned above. The laser of the wavelength in the visible region is a laser of approximately 380 nm to 780 nm in wavelength, preferably a green laser of 473 nm to 561 nm in wavelength, and more preferably a green laser of 532 nm in wavelength. The laser of the wavelength in the visible region has an oscillation mode that is a continuous wave mode or a quasi-continuous wave mode. Moreover, the laser of the wavelength in the visible region may be a solid-state laser device, or a laser device that uses a semiconductor laser element. A variation in irradiation energy density of the laser of the wavelength in the visible region on the amorphous silicon layer 14 is approximately less than 5%.

Figure 5D:
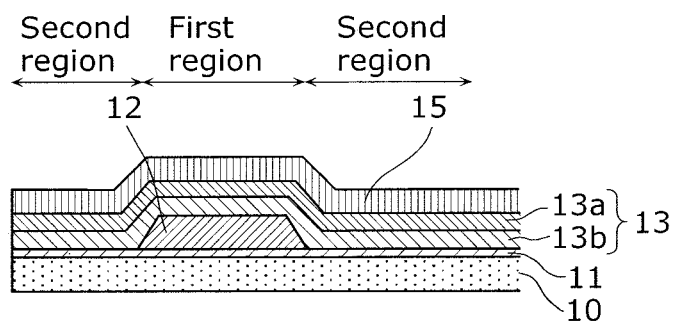
FIG. 5D is a cross-section diagram for describing the manufacturing method of the thin-film transistor in the display device in the embodiment of the present invention.

In Step S14, i.e. in the process from FIGS. 5C to 5D, the crystalline silicon layer 15 is produced by irradiating the amorphous silicon layer 14 with linearly focused laser light, as shown in FIG. 6. There are specifically two methods for such irradiation. In one method, an irradiation position of linearly focused laser light is fixed, and a stage carrying the substrate 10 where the amorphous silicon layer 14 is formed is moved. In the other method, the stage is fixed, and the irradiation position of the laser light is moved. In both methods, the amorphous silicon layer 14 is irradiated while moving the laser light relative to the amorphous silicon layer 14. The amorphous silicon layer 14 irradiated with the laser light in this way absorbs energy of the laser light and increases in temperature so as to be crystallized, and as a result becomes the crystalline silicon layer 15.

Following this, the second amorphous silicon layer 16 is formed (Step S15), and the silicon layer in the channel region of the thin-film transistor 100 is patterned (Step S16).

Figure 5E:
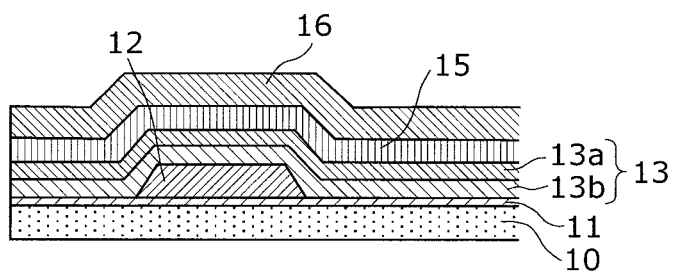
FIG. 5E is a cross-section diagram for describing the manufacturing method of the thin-film transistor in the display device in the embodiment of the present invention.
Figure 5F:
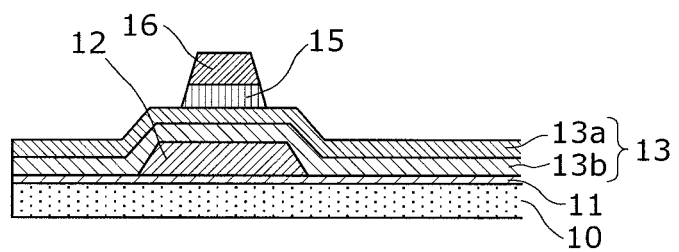
FIG. 5F is a cross-section diagram for describing the manufacturing method of the thin-film transistor in the display device in the embodiment of the present invention.

In detail, the second amorphous silicon layer 16 is formed on the gate insulation layer 13 by plasma CVD (FIG. 5E). The silicon film layer (the crystalline silicon layer 15 and the amorphous silicon layer 16) is then patterned so that the channel region of the thin-film transistor 100 remains, and portions of the amorphous silicon layer 16 and the crystalline silicon layer 15 to be removed are removed by etching (FIG. 5F). This enables a desired channel layer to be formed in the thin-film transistor 100.

Next, the n+ silicon layer 17 and the source and drain electrodes 18 are deposited (Step S17).

Figure 5G:
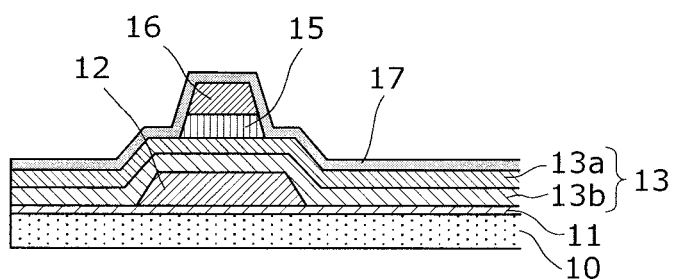
FIG. 5G is a cross-section diagram for describing the manufacturing method of the thin-film transistor in the display device in the embodiment of the present invention.
Figure 5H:
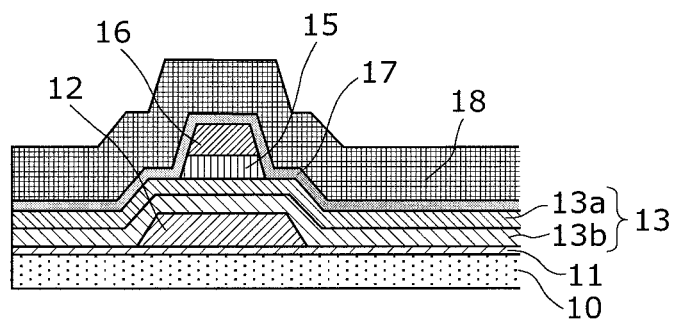
FIG. 5H is a cross-section diagram for describing the manufacturing method of the thin-film transistor in the display device in the embodiment of the present invention.

In detail, the n+ silicon layer 17 is deposited so as to cover the gate insulation layer 13 and the side surfaces of the amorphous silicon layer 16 and the crystalline silicon layer 15, by plasma CVD (FIG. 5G). The metal for the source and drain electrodes 18 is then deposited on the n+ silicon layer 17 by sputtering (FIG. 5H). Here, the source and drain electrodes 18 are made of a metal material including: metal such as Mo or an Mo alloy; metal such as titanium (Ti) or aluminum (Al), or an Al alloy; metal such as copper (Cu) or a Cu alloy; or metal such as silver (Ag), chromium (Cr), tantalum (Ta), tungsten (W), or the like.

Next, the source and drain electrodes 18 are patterned (Step S18). After this, the n+ silicon layer 17 is etched (Step S19). In this etching, the second amorphous silicon layer 16 is partially etched (Step S20).

Figure 5I:
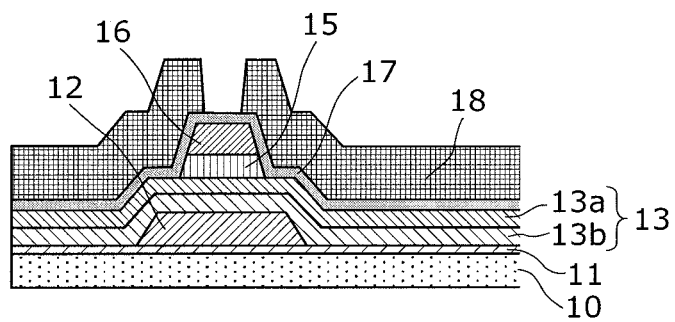
FIG. 5I is a cross-section diagram for describing the manufacturing method of the thin-film transistor in the display device in the embodiment of the present invention.
Figure 5J:
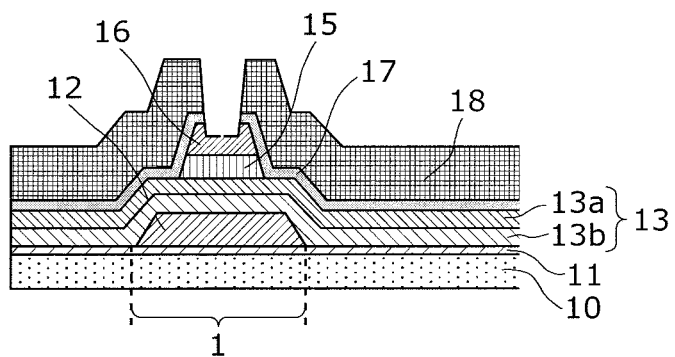
FIG. 5J is a cross-section diagram for describing the manufacturing method of the thin-film transistor in the display device in the embodiment of the present invention.

In detail, the source and drain electrodes 18 are formed by photolithography and etching (FIG. 5I). In addition, the n+ silicon layer 17 is etched, and also the amorphous silicon layer 16 in the channel region of the thin-film transistor 100 is partially etched (FIG. 5J). In other words, the amorphous silicon layer 16 is channel-etched so that the amorphous silicon layer 16 in the channel region of the thin-film transistor 100 partially remains.

The thin-film transistor 100 is manufactured in this way.

As described above, the thin-film transistor 100 in this embodiment is formed as a poly-Si TFT having the bottom-gate structure. When manufacturing the thin-film transistor 100, the gate insulation layer 13 and the amorphous silicon layer 14 are deposited with the respective film thicknesses that satisfy the aforementioned relational expressions. The amorphous silicon layer 14 made of a a-Si film is then crystallized by laser annealing using, for example, a green laser, and as a result changed into the crystalline silicon layer 15 made of poly-Si. Here, the gate electrode 12 can be brought into a thermally saturated state before the laser light reaches the amorphous silicon layer 14 corresponding to the channel region of the thin-film transistor 100. This enables uniform crystallization of the crystalline silicon layer 15 corresponding to the eventually created channel region.

That is, there are the appropriate ranges of the film thicknesses of the gate insulation layer 13 and the amorphous silicon layer 14 in the case of forming the crystalline silicon layer 15 by laser annealing crystallization.

This mechanism is described below.

Typically, when the amorphous silicon layer is irradiated with laser light, there is a correlation between a reached temperature of the amorphous silicon layer by heat generation and a degree of crystallinity of the crystalline silicon layer after crystallization. A higher reached temperature of the amorphous silicon layer by heat generation leads to a higher degree of crystallinity of the crystalline silicon layer formed as a result of crystallization. In view of this, for sufficient and uniform crystallization of the amorphous silicon layer in the first region (located above the region where the gate electrode is formed) in the thin-film transistor, it is necessary to ensure a uniform distribution of the reached temperature of the amorphous silicon layer in the first region in the thin-film transistor by heat generation.

In the thin-film transistor of the bottom-gate structure, however, the gate electrode is located below the amorphous silicon layer via the gate insulation layer, where the metal forming the gate electrode has a higher heat conductivity than the gate insulation layer. Accordingly, heat of the amorphous silicon layer generated by laser light irradiation is instantly transmitted to the gate electrode via the gate insulation layer. This causes an area where heat generation is insufficient to be created in the amorphous silicon layer located above the region where the gate electrode is formed, making the reached temperature of the amorphous silicon layer not uniform. For this reason, non-uniform crystallinity (non-uniform crystallization) occurs in the crystalline silicon layer after crystallization as shown in FIG. 1.

To avoid such a phenomenon that induces non-uniform crystallinity, it is desirable to thermally saturate the gate electrode before the laser light reaches the first region in the thin-film transistor, as described later. In view of this, the thin-film transistor 100 of the aforementioned structure is manufactured in this embodiment. That is, the amorphous silicon layer 14 and the gate insulation layer 13 are formed with the respective film thicknesses so as to satisfy X and Y in the ranges defined above. This allows the amorphous silicon layer 14 located above the region where the gate electrode 12 is not formed (i.e. in the second region) to generate more heat than the amorphous silicon layer 14 located above the region where the gate electrode 12 is formed (i.e. in the first region).

In other words, the amorphous silicon layer 14 and the gate insulation layer 13 are formed with the respective film thicknesses so as to satisfy X and Y in the ranges defined above, in the structure of the thin-film transistor 100 in this embodiment. In such a structure, heat generated in the amorphous silicon layer 14 located above the region where the gate electrode 12 is not formed (i.e. in the second region) by laser light irradiation is transmitted to the gate electrode 12 to cause an increase in temperature of the gate electrode 12, before the laser light reaches the amorphous silicon layer 14 located above the region where the gate electrode 12 is formed (i.e. in the first region). Thus, the gate electrode 12 is preheated before the laser light reaches. This is because, when the amorphous silicon layer 14 in the second region is irradiated with the laser light to generate heat, the temperature is higher in the second region than in the first region where the laser light has not reached yet due to the aforementioned structure, so that heat generated in the amorphous silicon layer 14 in the second region is transmitted to the gate electrode 12 and increases the temperature of the gate electrode 12. Subsequently, when the laser light reaches the first region, the amorphous silicon layer 14 in the first region generates heat, and heat corresponding to a heating value of the amorphous silicon layer 14 in the first region is transmitted to the gate electrode 12 (laser light heating). The gate electrode 12 is heated by both this laser light heating and the preheating mentioned earlier, and as a result thermally saturated. Here, thermally saturating the gate electrode 12 means that the in-plane temperature of the gate electrode 12 is made uniform.

Thus, according to the structure of the thin-film transistor in this embodiment, the gate electrode 12 can be thermally saturated when crystallizing the amorphous silicon layer 14. This provides an advantageous effect of producing the crystalline silicon layer 15 of uniform crystallinity, because heat by laser light for crystallizing the amorphous silicon layer 14 is used to form the crystalline silicon layer 15 without being absorbed by the gate electrode 12.

The following describes a method of calculating $\Delta A'$. As noted above, the advantageous effects of this embodiment can be achieved when the difference in normalized absorptance for the laser light between the amorphous silicon layer 14 located above the region where the gate electrode 12 is formed (i.e. in the first region) and the amorphous silicon layer 14 located above the region where the gate electrode 12 is not formed (i.e. in the second region) is equal to or less than $-\Delta A'$.

It is assumed here that 100% of energy of the laser light absorbed by the amorphous silicon layer 14 contributes to heat generation of the amorphous silicon layer 14, with energy of the laser light per unit area being denoted as an energy density E. In the following description, the amorphous silicon layer 14 located above the region where the gate electrode 12 is formed (i.e. in the first region) is referred to as the amorphous silicon layer 14 in the first region, whereas the amorphous silicon layer 14 located above the region where the gate electrode 12 is not formed (i.e. in the second region) is referred to as the amorphous silicon layer 14 in the second region. Let $A_{Si1}$ be the absorptance of the amorphous silicon layer 14 in the first region for the wavelength of the laser light, and $Q_{Si1}$ be the heating value (per unit area) of the amorphous silicon layer 14 as a result of absorbing the laser light. Let $A_{Si2}$ be the absorptance of the amorphous silicon layer 14 in the second region for the wavelength of the laser light, and $Q_{Si2}$ be the heating value (per unit area) of the amorphous silicon layer 14 as a result of absorbing the laser light. Moreover, in the structure in which the gate insulation layer 13 is formed on the gate electrode 12 and the amorphous silicon layer 14 is formed on the gate insulation layer 13, let $A_G$ be the laser light absorptance of the gate electrode 12, and $Q_G$ be the heating value (per unit area) of the gate electrode 12 as a result of absorbing the laser light.

Suppose, when the amorphous silicon layer 14 and the gate insulation layer 13 have predetermined film thicknesses, the absorptance of the amorphous silicon layer 14 in the first region for the wavelength of the laser light and the absorptance of the amorphous silicon layer 14 in the second region for the wavelength of the laser light are equal to each other, i.e. $A_{Si1}=A_{Si2}$. In such a case, $Q_{Si1}=Q_{Si2}$. In actuality, however, light passing through the amorphous silicon layer 14 is also absorbed by the gate electrode 12 and so the gate electrode 12 generates heat, too ($Q_G>0$). Hence, the amorphous silicon layer 14 in the first region has a higher heat generation temperature than the amorphous silicon layer 14 in the second region.

The above suggests that, when the heating value of the amorphous silicon layer 14 in the second region is equal to or higher than a total sum of the heating value of the amorphous silicon layer 14 in the first region and the heating value of the gate electrode 12, the heat generation temperature of the amorphous silicon layer 14 in the second region is equal to or higher than the heat generation temperature of the amorphous silicon layer 14 in the first region. This relation can be represented by (Expression 9).

$$Q_{Si1}+Q_G \leq Q_{Si2} \quad \text{(Expression 9)}$$

Modifying (Expression 9) yields (Expression 10).

$$Q_{Si1}-Q_{Si2} \leq -Q_G \quad \text{(Expression 10)}$$

When the film thickness, the density, and the specific heat of the amorphous silicon layer 14 are respectively denoted by $d_{Si}$, $\rho_{Si}$, and $c_{Si}$ and the film thickness, the density, and the specific heat of the gate electrode 12 are respectively denoted by $d_G$, $\rho_G$, and $c_G$, the heating value of the amorphous silicon layer 14 in the first region, the heating value of the amorphous silicon layer 14 in the second region, and the heating value of the gate electrode 12 can be expressed as follows.

$$Q_{Si1}=E \times A_{Si1}/(d_{Si} \times \rho_{Si} \times c_{Si})$$

$$Q_{Si2}=E \times A_{Si2}/(d_{Si} \times \rho_{Si} \times c_{Si})$$

$$Q_G=E \times A_G/(d_G \times \rho_G \times c_G)$$

Substituting these expressions into (Expression 10) and rearranging (Expression 10) yields (Expression 11).

$$(A_{Si1}-A_{Si2})/d_{Si} \leq -(A_G/d_G) \times (\rho_{Si} \times c_{Si})/(\rho_G \times c_G) \quad \text{(Expression 11)}$$

Here, the result of dividing the absorptance by the film thickness is defined as the normalized absorptance, so that $A_{Si1}/d_{Si}=A_{Si1}'$ and $A_{Si2}/d_{Si}=A_{Si2}'$. In addition, the right side of (Expression 11) is defined as $-\Delta A'$. Since (Expression 11) can be written as $A_{Si1}'-A_{Si2}' \leq -\Delta A'$, (Expression 8) is derived.

(Expression 8) indicates the following. When the film thickness of the amorphous silicon layer 14 and the film thickness of the gate insulation layer 13 satisfy the condition that the difference between the normalized absorptance of the amorphous silicon layer 14 in the first region and the normalized absorptance of the amorphous silicon layer 14 in the second region is equal to or less than the value defined as $-\Delta A'$, the heat generation temperature of the amorphous silicon layer 14 in the second region is equal to or higher than the heat generation temperature of the amorphous silicon layer 14 in the first region. By forming the amorphous silicon layer 14 and the gate insulation layer 13 with the respective film thicknesses that satisfy this condition, in the case of laser annealing (crystallizing) the amorphous silicon layer 14 using, for example, a green laser, the influence of heat absorption and heat transmission by the gate electrode 12 on the crystallization can be reduced. Hence, the distribution of the reached temperature of the amorphous silicon layer 14 in the first region in the thin-film transistor 100 by heat generation can be made uniform.

In this way, the crystalline silicon layer 15 can be produced by sufficiently and uniformly crystallizing the amorphous silicon layer 14 in the first region in the thin-film transistor 100 without depending on the wavelength of the laser light and the material and the film thickness of the gate electrode 12, as indicated by (Expression 8).

As described above, by forming the gate insulation layer 13 and the amorphous silicon layer 14 with the respective film thicknesses so as to satisfy the aforementioned condition, the crystalline silicon layer 15 of uniform crystallinity can be produced even with various laser light wavelengths and gate electrode materials and film thicknesses. A variation in crystallinity in the crystalline silicon layer 15 formed above the gate electrode 12 can be reduced to achieve stable crystallization, without a particular change in the structure of the thin-film transistor 100 such as the pattern shape of the gate electrode 12. As a result, a variation in characteristics of the thin-film transistor 100 that uses the crystalline silicon layer 15 can be suppressed. This provides an advantageous effect of improving display quality of a display device such as a LCD or an OLED even in the case where the display device is increased in resolution.

Though an example where the amorphous silicon layer is crystallized using linearly focused laser light is described here, the present invention may also be applied to spot laser light (circular, elliptic, and so on). In this case, a laser light scan method suitable for crystallization is preferably employed.

As described above, according to the manufacturing method of the thin-film transistor 100 in this embodiment, the film thickness of the amorphous silicon layer 14 and the film thickness of the gate insulation layer 13 satisfy the aforementioned condition to ensure a uniform distribution of the reached temperature of the amorphous silicon layer 14 in the first region by heat generation, as a result of which the amorphous silicon layer 14 in the first region can be sufficiently and uniformly crystallized.

The condition to be satisfied by the film thickness of the amorphous silicon layer 14 and the film thickness of the gate insulation layer 13 is described in detail below, by way of an example.

EXAMPLE

A calculation method is described first.

FIGS. 7A and 7B are diagrams for describing a method of calculating an amplitude reflectance and an amplitude transmittance.

FIGS. 7A and 7B each show a model structure of a multi-layer structure that models the structure of the thin-film transistor 100 shown in FIG. 2. A model structure shown in FIG. 7A includes a layer 401 having a complex refractive index $N_1$, a layer 402 having a complex refractive index $N_2$, a layer 403 having a complex refractive index $N_3$, a layer 404 having a complex refractive index $N_4$, and a substrate 405 having a complex refractive index $N_5$. In this model structure, the layers 404, 403, 402, and 401 are formed on the substrate 405 in this order. A model structure shown in FIG. 7B is a model structure in which the layer 404 in FIG. 7A is omitted. A region having a complex refractive index $N_0$ in each of FIGS. 7A and 7B is outside the model structure, on a side where the laser light enters the model structure. For instance, this region is air. In such a case, the region has a refractive index of 1 and an extinction coefficient of 0.

The substrate 405 is an insulation substrate made of, for example, transparent glass or quartz, has a refractive index of 1.46 as an example, and corresponds to the substrate 10 shown in FIG. 5A. The layer 404 has a refractive index of 3.47 and an extinction coefficient of 3.78 as an example, made of MoW with a film thickness of 50 nm, and corresponds to the gate electrode 12 shown in FIG. 5A. The layer 403 is made of silicon nitride (SiNx) having a refractive index of 1.947 and an extinction coefficient of 0 as an example. The layer 402 is made of silicon oxide (SiOx) having a refractive index of 1.467 and an extinction coefficient of 0 as an example. A stacked film of the layers 403 and 402 corresponds to the gate insulation layer 13 shown in FIG. 5B. The layer 401 corresponds to the amorphous silicon layer 14 having a refractive index of 5.074 and an extinction coefficient of 0.621 as an example.

Note that a layer corresponding to the undercoat layer 11 is omitted in this model structure, for the following reason. Given that the undercoat layer 11 is a transparent layer and does not absorb the laser light, the undercoat layer 11 does not affect the result of calculation regardless of its film thickness. Accordingly, the following calculation is performed using the model structure in which the layer corresponding to the undercoat layer 11 is omitted.

As shown in FIGS. 7A and 7B, $r_{01}$ denotes an amplitude reflection coefficient for light entering the layer 401 from outside, $r_{12}$ denotes an amplitude reflection coefficient for light entering the layer 402 from the layer 401, $r_{23}$ denotes an amplitude reflection coefficient for light entering the layer 403 from the layer 402, $r_{34}$ denotes an amplitude reflection coefficient for light entering the layer 404 from the layer 403, and $r_{35}$ denotes an amplitude reflection coefficient for light entering the substrate 405 from the layer 403. Meanwhile, $t_{01}$ denotes an amplitude transmission coefficient for light entering the layer 401 from outside, $t_{12}$ denotes an amplitude transmission coefficient for light entering the layer 402 from the layer 401, $t_{23}$ denotes an amplitude transmission coefficient for light entering the layer 403 from the layer 402, $t_{34}$ denotes an amplitude transmission coefficient for light entering the layer 404 from the layer 403, and $t_{35}$ denotes an amplitude transmission coefficient for light entering the substrate 405 from the layer 403.

Further, $r_{01234}$ (R1), $r_{1234}$ (R2), and $r_{234}$ (R3) each denote an amplitude reflection coefficient of all layers located above a region where the layer 404 corresponding to the gate electrode 12 is formed (i.e. in the first region). In detail, $r_{234}$ (R3) denotes an amplitude reflection coefficient when the layers 404 and 403 are regarded as one layer. Likewise, $r_{1234}$ (R2) denotes an amplitude reflection coefficient when the layers 404, 403, and 402 are regarded as one layer, and $r_{01234}$ (R1) denotes an amplitude reflection coefficient when the layers 404, 403, 402, and 401 are regarded as one layer. Meanwhile, $t_{01234}$ (T1), $t_{1234}$ (T2), and $t_{234}$ (T3) each denote an amplitude transmission coefficient of all layers in the first region. In detail, $t_{234}$ (T3) denotes an amplitude transmission coefficient when the layers 404 and 403 are regarded as one layer. Likewise, $t_{1234}$ (T2) denotes an amplitude transmission coefficient when the layers 404, 403, and 402 are regarded as one layer, and $t_{01234}$ (T1) denotes an amplitude transmission coefficient when the layers 404, 403, 402, and 401 are regarded as one layer.

As shown in FIG. 7B, $r_{01235}$ (R1'), $r_{1235}$ (R2'), and $r_{235}$ (R3') each denote an amplitude reflection coefficient of all layers located above a region where the layer 404 corresponding to the gate electrode 12 is not formed (i.e. in the second region). In detail, $r_{235}$ (R3') denotes an amplitude reflection coefficient when the substrate 405 and the layer 403 are regarded as one layer. Likewise, $r_{1235}$ (R2') denotes an amplitude reflection coefficient when the substrate 405 and the layers 403 and 402 are regarded as one layer, and $r_{01235}$ (R1') denotes an amplitude reflection coefficient when the substrate 405 and the layers 403, 402, and 401 are regarded as one layer. Meanwhile, $t_{01235}$ (T1'), $t_{1235}$ (T2'), and $t_{235}$ (T3') each denote an amplitude transmission coefficient of all layers in the second region. In detail, $t_{235}$ (T3') denotes an amplitude transmission coefficient when the substrate 405 and the layer 403 are regarded as one layer. Likewise, $t_{1235}$ (T2') denotes an amplitude transmission coefficient when the substrate 405 and the layers 403 and 402 are regarded as one layer, and $t_{01235}$ (T1') denotes an amplitude transmission coefficient when the substrate 405 and the layers 403, 402, and 401 are regarded as one layer.

The amplitude reflection coefficient and the amplitude transmission coefficient of all layers in the first region can be represented by the following (Expression 12) to (Expression 17).

(Expression 12)

$$r_{01234} = \frac{r_{01} + r_{1234}\exp(-i2\beta_1)}{1 + r_{01}r_{1234}\exp(-i2\beta_1)}$$ [Math. 1]

(Expression 13)

$$r_{1234} = \frac{r_{12} + r_{234}\exp(-i2\beta_2)}{1 + r_{12}r_{234}\exp(-i2\beta_2)} \quad \text{[Math. 2]}$$

(Expression 14)

$$r_{234} = \frac{r_{23} + r_{34}\exp(-i2\beta_3)}{1 + r_{23}r_{34}\exp(-i2\beta_3)} \quad \text{[Math. 3]}$$

(Expression 15)

$$t_{01234} = \frac{t_{01}t_{1234}\exp(-i\beta_1)}{1 + r_{01}r_{1234}\exp(-i2\beta_1)} \quad \text{[Math. 4]}$$

(Expression 16)

$$t_{1234} = \frac{t_{12}t_{234}\exp(-i\beta_2)}{1 + r_{12}r_{234}\exp(-i2\beta_2)} \quad \text{[Math. 5]}$$

(Expression 17)

$$t_{234} = \frac{t_{23}t_{34}\exp(-i\beta_3)}{1 + r_{23}r_{34}\exp(-i2\beta_3)} \quad \text{[Math. 6]}$$

On the other hand, the amplitude reflection coefficient and the amplitude transmission coefficient of all layers in the second region can be represented by the following (Expression 18) to (Expression 23).

(Expression 18)

$$r_{01235} = \frac{r_{01}r_{1235}\exp(-i2\beta_1)}{1 + r_{01}r_{1235}\exp(-i2\beta_1)} \quad \text{[Math. 7]}$$

(Expression 19)

$$r_{1235} = \frac{r_{12} + r_{235}\exp(-i2\beta_2)}{1 + r_{12}r_{235}\exp(-i2\beta_2)} \quad \text{[Math. 8]}$$

(Expression 20)

$$r_{235} = \frac{r_{23} + r_{35}\exp(-i2\beta_3)}{1 + r_{23}r_{35}\exp(-i2\beta_3)} \quad \text{[Math. 9]}$$

(Expression 21)

$$t_{01235} = \frac{t_{01}t_{1235}\exp(-i\beta_1)}{1 + r_{01}r_{1235}\exp(-i2\beta_1)} \quad \text{[Math. 10]}$$

(Expression 22)

$$t_{1235} = \frac{t_{12}t_{235}\exp(-i\beta_2)}{1 + r_{12}r_{235}\exp(-i2\beta_2)} \quad \text{[Math. 11]}$$

(Expression 23)

$$t_{235} = \frac{t_{23}t_{35}\exp(-i\beta_3)}{1 + r_{23}r_{35}\exp(-i2\beta_3)} \quad \text{[Math. 12]}$$

Here, $\beta_1 = 2\pi d_1 N_1 \cos\theta_1/\lambda$ [Math. 13]

$\beta_2 = 2\pi d_2 N_2 \cos\theta_2/\lambda$ [Math. 14]

$\beta_3 = 2\pi d_3 N_3 \cos\theta_3/\lambda$ [Math. 15]

where d is the film thickness of each layer, θ is the angle of incidence/transmission in each layer, and is the wavelength of the laser light.

θ can be calculated according to Snell's law in the following manner.

$N_0 \sin\theta_0 = N_1 \sin\theta_1 = N_2 \sin\theta_2 = N_3 \sin\theta_3 = N_4 \sin\theta_4 = N_5 \sin\theta_5$ [Math. 16]

The amplitude reflection coefficients $r_{01}, r_{12}, r_{23}, r_{34}$, and $r_{35}$ and the amplitude transmission coefficients $t_{01}, t_{12}, t_{23}, t_{34}$, and $t_{35}$ of the individual layers can be calculated using the following (Expression 24) to (Expression 33).

(Expression 24)

$$r_{01} = \frac{N_0\cos\theta_1 - N_1\cos\theta_0}{N_0\cos\theta_1 + N_1\cos\theta_0} \quad \text{[Math. 17]}$$

(Expression 25)

$$r_{12} = \frac{N_1\cos\theta_2 - N_2\cos\theta_1}{N_1\cos\theta_2 + N_2\cos\theta_1} \quad \text{[Math. 18]}$$

(Expression 26)

$$r_{23} = \frac{N_2\cos\theta_3 - N_3\cos\theta_2}{N_2\cos\theta_3 + N_3\cos\theta_2} \quad \text{[Math. 19]}$$

(Expression 27)

$$r_{34} = \frac{N_3\cos\theta_4 - N_4\cos\theta_3}{N_3\cos\theta_4 + N_4\cos\theta_3} \quad \text{[Math. 20]}$$

(Expression 28)

$$r_{35} = \frac{N_3\cos\theta_5 - N_5\cos\theta_3}{N_3\cos\theta_5 + N_5\cos\theta_3} \quad \text{[Math. 21]}$$

(Expression 29)

$$t_{01} = \frac{2N_0\cos\theta_1}{N_0\cos\theta_1 + N_1\cos\theta_0} \quad \text{[Math. 22]}$$

(Expression 30)

$$t_{12} = \frac{2N_1\cos\theta_2}{N_1\cos\theta_2 + N_2\cos\theta_1} \quad \text{[Math. 23]}$$

(Expression 31)

$$t_{23} = \frac{2N_2\cos\theta_3}{N_2\cos\theta_3 + N_3\cos\theta_2} \quad \text{[Math. 24]}$$

(Expression 32)

$$t_{34} = \frac{2N_3\cos\theta_4}{N_3\cos\theta_4 + N_4\cos\theta_3} \quad \text{[Math. 25]}$$

(Expression 33)

$$t_{35} = \frac{2N_3\cos\theta_5}{N_3\cos\theta_5 + N_5\cos\theta_3} \quad \text{[Math. 26]}$$

It is assumed here that the light is monochromatic laser light, and p-polarized.

Following this, the amplitude reflection coefficient and the amplitude transmission coefficient of all layers in the first region are calculated as follows, using the aforementioned expressions. First, $r_{234}$ is calculated by substituting (Expression 26) and (Expression 27) into (Expression 14). Next, $r_{1234}$ is calculated by substituting (Expression 25) and $r_{234}$ into (Expression 13). Next, $r_{01234}$ is calculated by substituting (Expression 24) and $r_{1234}$ into (Expression 12). Next, $t_{234}$ is calculated by substituting (Expression 26), (Expression 27), (Expression 31), and (Expression 32) into (Expression 17). Next, $t_{1234}$ is calculated by substituting (Expression 25), (Expression 30), $r_{234}$, and $t_{234}$ into (Expression 16). Next, $t_{01234}$ is calculated by substituting (Expression 24), (Expression 29), $r_{1234}$, and $t_{1234}$ into (Expression 15).

Moreover, the amplitude reflection coefficient and the amplitude transmission coefficient of all layers in the second region are calculated as follows. First, $r_{235}$ is calculated by substituting (Expression 26) and (Expression 28) into (Expression 20). Next, $r_{1235}$ is calculated by substituting (Expression 25) and $r_{235}$ into (Expression 19). Next, $r_{01235}$ is calculated by substituting (Expression 24) and $r_{1235}$ into (Expression 18). Next, $t_{235}$ is calculated by substituting (Expression 26), (Expression 28), (Expression 31), and (Expression 33) into (Expression 23). Next, $t_{1235}$ is calculated by substituting (Expression 25), (Expression 30), $r_{235}$, and $t_{235}$ into (Expression 22). Next, $t_{01235}$ is calculated by substituting (Expression 24), (Expression 29), $r_{1235}$, and $t_{1235}$ into (Expression 21).

The reflectances R1, R2, and R3 and the transmittances T1, T2, and T3 of the layers in the first region are then calculated according to (Expression 34) to (Expression 39).

(Expression 34)
$$R_1 = |r_{01234}|^2 \quad \text{[Math. 27]}$$

(Expression 35)
$$R_2 = |r_{1234}|^2 \quad \text{[Math. 28]}$$

(Expression 36)
$$R_3 = |r_{234}|^2 \quad \text{[Math. 29]}$$

(Expression 37)
$$T_1 = \left(\frac{Re(N_4)\cos\theta_0}{Re(N_0)\cos\theta_4}\right)|t_{01234}|^2 \quad \text{[Math. 30]}$$

(Expression 38)
$$T_2 = \left(\frac{Re(N_4)\cos\theta_1}{Re(N_1)\cos\theta_4}\right)|t_{1234}|^2 \quad \text{[Math. 31]}$$

(Expression 39)
$$T_3 = \left(\frac{Re(N_4)\cos\theta_2}{Re(N_2)\cos\theta_4}\right)|t_{234}|^2 \quad \text{[Math. 32]}$$

The reflectances R1', R2', and R3' and the transmittances T1', T2', and T3' of the layers in the second region are calculated according to (Expression 40) to (Expression 45).

(Expression 40)
$$R_1' = |r_{01235}|^2 \quad \text{[Math. 33]}$$

(Expression 41)
$$R_2' = |r_{1235}|^2 \quad \text{[Math. 34]}$$

(Expression 42)
$$R_3' = |r_{235}|^2 \quad \text{[Math. 35]}$$

(Expression 43)
$$T_1' = \left(\frac{Re(N_5)\cos\theta_0}{Re(N_0)\cos\theta_5}\right)|t_{01235}|^2 \quad \text{[Math. 36]}$$

(Expression 44)
$$T_2' = \left(\frac{Re(N_5)\cos\theta_1}{Re(N_1)\cos\theta_5}\right)|t_{1235}|^2 \quad \text{[Math. 37]}$$

(Expression 45)
$$T_3' = \left(\frac{Re(N_5)\cos\theta_2}{Re(N_2)\cos\theta_5}\right)|t_{235}|^2 \quad \text{[Math. 38]}$$

Lastly, the light absorptance $A_{Si1}$ of the amorphous silicon layer in the first region can be calculated according to (Expression 46).

[Math. 39]
$$A_{Si1} = 1 - (R_1 + T_1) \quad \text{(Expression 46)}$$

Likewise, the light absorptance $A_{Si2}$ of the amorphous silicon layer in the second region can be calculated according to (Expression 47).

[Math. 40]
$$A_{Si2} = 1 - (R_1' + T_1') \quad \text{(Expression 47)}$$

Thus, the value obtained by subtracting the normalized absorptance $A_{Si2}'$ of the amorphous silicon layer in the second region from the normalized absorptance $A_{Si1}'$ of the amorphous silicon layer in the first region can be calculated using the film thickness $d_{Si}$ of the amorphous silicon layer.

In the case where green laser light of the wavelength λ (473 nm≤λ≤561 nm) enters the model structures shown in FIGS. 7A and 7B perpendicularly, i.e. at the incidence angle $\theta_0$ in a range where $\theta_0=0$ or $\sin\theta_0=0$ approximately holds, the normalized absorptance of the amorphous silicon layer in the first region and the normalized absorptance of the amorphous silicon layer in the second region for the laser light are calculated to find their difference, using the aforementioned calculation method. Note that the same calculation result is obtained even when the laser light is s-polarized.

Figure 8:
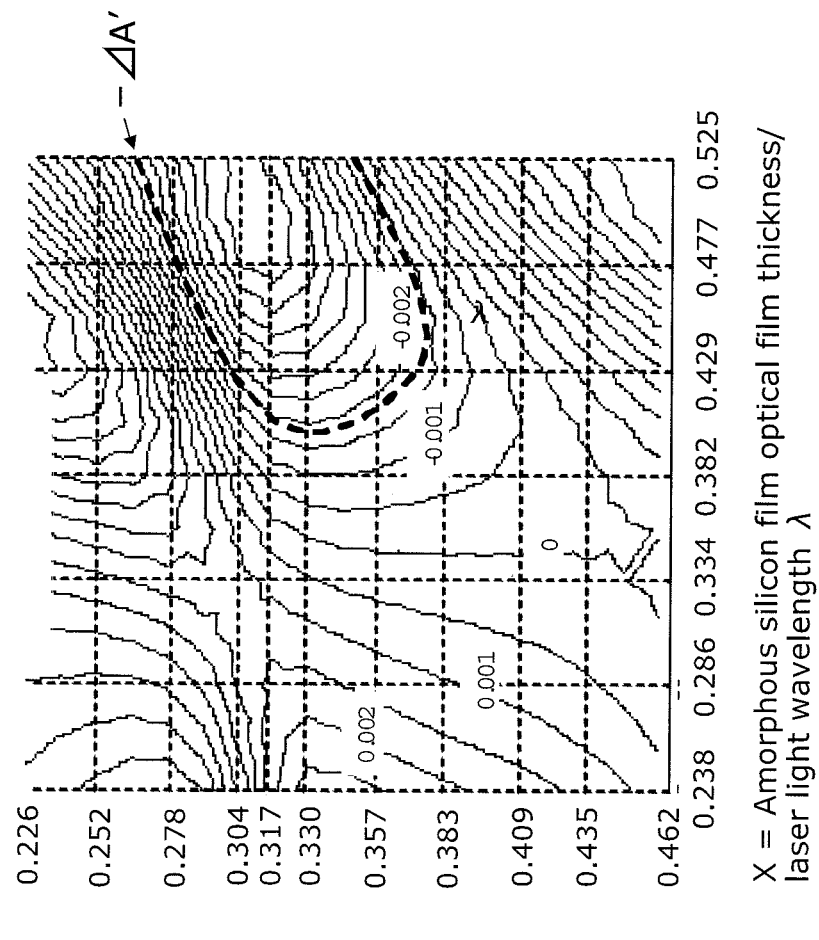
FIG. 8 is a diagram showing that there are appropriate film thickness ranges of a gate insulation layer and an amorphous silicon layer in the case of forming a crystalline silicon layer by laser annealing crystallization.

FIG. 8 is a diagram showing that there are the appropriate film thickness ranges of the gate insulation layer 13 and the amorphous silicon layer 14 in the case of forming the crystalline silicon layer 15 by laser annealing crystallization. In detail, FIG. 8 is a contour diagram showing a result of calculating the normalized absorptance difference $A_{Si1}' - A_{Si2}'$ between the amorphous silicon layer 14 in the first region and the amorphous silicon layer 14 in the second region, in the case of changing each of the film thickness of the amorphous silicon layer 14 and the film thickness of the stacked film of the silicon oxide layer 13a and the silicon nitride layer 13b using the model structures shown in FIGS. 7A and 7B. A horizontal axis represents the value $(n_{Si} \times d_{Si})/\lambda$ obtained by dividing the optical film thickness of the amorphous silicon layer 14 by the laser light wavelength λ, where the optical film thickness of the amorphous silicon layer 14 is a result of multiplying the refractive index $n_{Si}$ of the amorphous silicon layer 14 by the film thickness $d_{Si}$ of the amorphous silicon layer 14. A vertical axis represents the value $(n_{SiO} \times d_{SiO} + n_{SiN} \times d_{SiN})/n_{SiO}/\lambda$ obtained by dividing $(n_{SiO} \times d_{SiO} + n_{SiN} \times d_{SiN})/n_{SiO}$ by the laser light wavelength λ, where $(n_{SiO} \times d_{SiO} + n_{SiN} \times d_{SiN})/n_{SiO}$ is an optical film thickness obtained by converting the stacked film of the silicon oxide layer 13a and the silicon nitride layer 13b by the refractive index $n_{SiO}$ of the silicon oxide layer 13a. Here, $d_{SiO}$ denotes the film thickness of the silicon oxide layer 13a, $n_{SiN}$ denotes the refractive index of the silicon nitride layer 13b, and $d_{SiN}$ denotes the film thickness of the silicon nitride layer 13b.

In the stacked film of the silicon oxide layer 13a and the silicon nitride layer 13b in the model structures, the film thickness of the silicon oxide layer 13a and the film thickness of the silicon nitride layer 13b are changed so that the stacked film has a constant total capacitance. In detail, let $\epsilon_{SiO}$ and $\epsilon_{SiN}$ be respectively relative permittivities of the silicon oxide layer 13a and the silicon nitride layer 13b, and $\epsilon_0$ be a vacuum permittivity. Then the film thickness of the silicon oxide layer 13a and the film thickness of the silicon nitride layer 13b are changed so that the stacked film of the silicon oxide layer 13a and the silicon nitride layer 13b has a constant total capacitance $C_{total} = \epsilon_0/(d_{SiO}/\epsilon_{SiO} + d_{SiN}/\epsilon_{SiN})$ per unit area.

The value in the horizontal axis in FIG. 8 can be converted to the film thickness of the amorphous silicon layer 14, through the use of the refractive index of the amorphous silicon layer 14 when λ=532 nm as an example. FIG. 9 is a diagram showing an example of a result of converting the value in the horizontal axis in FIG. 8 to the film thickness of the amorphous silicon layer 14. The film thickness of the amorphous silicon layer 14 converted from the value in the horizontal axis in FIG. 8 when λ=532 nm, when λ=473 nm, and when λ=569 nm is shown in FIG. 9.

In addition, the film thicknesses of the silicon oxide layer 13a and the silicon nitride layer 13b that constitute the gate insulation layer 13 can be calculated from the value in the vertical axis in FIG. 8, through the use of the refractive index of each of the silicon oxide layer 13a and the silicon nitride layer 13b when λ=532 nm as an example. FIGS. 10A to 10C are diagrams each showing an example of a result of converting the value in the vertical axis in FIG. 8 to the film thicknesses of the silicon oxide layer 13a and the silicon nitride layer 13b that constitute the gate insulation layer 13. The film thickness of the silicon oxide layer 13a and the film thickness of the silicon nitride layer 13b calculated when λ=532 nm are shown in FIG. 10A. Likewise, the film thickness of the silicon oxide layer 13a and the film thickness of the silicon nitride layer 13b calculated when λ=561 nm and when λ=473 nm are shown respectively in FIGS. 10B and 10C. Here, the relative permittivity of the silicon oxide layer 13a and the relative permittivity of the silicon nitride layer 13b are calculated at 4.1 and 7.9, respectively. C in the drawings denotes the total capacitance $C_{total}$ of the stacked film of the silicon oxide layer 13a and the silicon nitride layer 13b, indicating that the total capacitance is fixed at a capacitance C of a film thickness in the case where the gate insulation layer 13 is made of a silicon oxide single layer. For example, C=140 nm indicates that the total capacitance is a capacitance in the case where the gate insulation layer 13 is made of a silicon oxide single layer of 140 nm. Likewise, C=120 nm and C=100 nm respectively indicate that the total capacitance is a capacitance in the case where the gate insulation layer 13 is made of a silicon oxide single layer of 120 nm and 100 nm.

In FIG. 8, an area on and inside a contour represented by −ΔA' is an area where the normalized absorptance difference $A_{Si1}' - A_{Si2}'$ between the amorphous silicon layer 14 in the first region and the amorphous silicon layer 14 in the second region is equal to or less than −ΔA'. In other words, a dotted curve in FIG. 8 represents a contour where the normalized absorptance difference is −0.00176. That is, the normalized absorptance difference in the area on and inside the curve is equal to or less than −0.00176. This area is calculated from the film thicknesses of the amorphous silicon layer 14 and the gate insulation layer 13, the optical constants of the amorphous silicon layer 14 and the gate insulation layer 13, and the optical constants of the gate electrode 12 and the substrate 10, according to the aforementioned expressions (calculation method). When the calculated normalized absorptance difference $A_{Si1}' - A_{Si2}'$ between the amorphous silicon layer 14 in the first region and the amorphous silicon layer 14 in the second region is equal to or less than −ΔA', a uniform distribution of the reached temperature of the amorphous silicon layer 14 in the first region in the thin-film transistor 100 by heat generation can be attained. As a result, the amorphous silicon layer 14 in the first region is sufficiently and uniformly crystallized to become the crystalline silicon layer 15.

FIG. 11 is a diagram used for calculating the appropriate film thickness ranges of the gate insulation layer 13 and the amorphous silicon layer 14 in FIG. 8.

In FIG. 11, X denotes the value obtained by dividing the optical film thickness of the amorphous silicon layer 14 by the wavelength of the laser light, and Y denotes the value obtained by dividing, by the wavelength of the laser light, the optical film thickness which is the result of converting the stacked film of the silicon oxide layer 13a and the silicon nitride layer 13b by the refractive index of the silicon oxide layer 13a. These X and Y are the same as those defined earlier. The area on and inside the contour represented by −ΔA' is approximated by an expression, using X and Y. That is, the area can be represented by a product of sets denoted by L1 to L5 in (Expression 48).

[Math. 41]

$$L1 \cap L2 \cap L3 \cap L4 \cap L5 \qquad \text{(Expression 48)}$$

L1 to L5 can be written as follows, which respectively correspond to (Expression 1) to (Expression 5) mentioned above.

$L1: Y \leq -0.198X + (0.343 - 10.83\Delta A')$ $L2: Y \geq -0.236X + (0.481 - 8.83\Delta A')$ $L3: X \geq 0.346 + C3 (C3 = -36\Delta A' + 0.0007(-0.0011 < \Delta A' < 0)$ and $C3 = -18.636\Delta A' + 0.0198$ $(\Delta A' \leq -0.0011))$ $L4: Y \geq 0.435 + C4 (C4 = 52\Delta A' - 0.0033(-0.00104 < \Delta A' < 0)$ and $C4 = 14.582\Delta A' - 0.0422$ $(\Delta A' \leq -0.00104))$ $L5: Y \geq (0.00053/(-\Delta A')^{\wedge}1.18) \times (X - 0.346) + 0.291$ $(\Delta A' < 0)$ Note that ΔA' is defined as $\Delta A' = (A_G/d_G) \times (\rho_{Si} \times c_{Si})/(\rho_G \times c_G)$ as mentioned above, where $\rho_{Si}$ and $c_{Si}$ are respectively the density and the specific heat of the amorphous silicon layer 14, and $d_G$, $\rho_G$, and $c_G$ are respectively the film thickness, the density, and the specific heat of the gate electrode 12.

Next, consider the case of applying green laser light of 532 nm in wavelength perpendicularly from above the model structures shown in FIGS. 7A and 7B. Suppose the amorphous silicon layer 14 has a density of 2340 (kg/m³) and a specific heat of 1252 (J/(kg·K)), and the gate electrode 12 is MoW with a film thickness of 50 nm, a density of 11720 (kg/m³), and a specific heat of 226.4 (J/(kg·K)). In this case, it is assumed that the absorptance of the amorphous silicon layer 14 in the first region for the wavelength of the laser light and the absorptance of the amorphous silicon layer 14 in the second region for the wavelength of the laser light are equal to each other, that is, $A_{Si1} = A_{Si2}$. The maximum absorptance $A_G$ of the gate electrode 12 is calculated using the film thickness of the amorphous silicon layer 14 and the film thicknesses of the silicon oxide layer 13a and the silicon nitride layer 13b that constitute the gate insulation layer 13 when $A_{Si1} = A_{Si2}$ and the aforementioned optical expressions (Expression 12) to (Expression 47). As a result, $A_G = 0.14$. From this, ΔA' is calculated at 0.00176. Note that $A_G$ is obtained from a relational expression $A_G = T1 \times T2 \times T3 \times (1 - R_G)$. $R_G$ is a reflectance of the gate electrode 12 in the case where silicon nitride is used as a medium, where $R_G \{(n_{SiN} - n_G)^{\wedge}2 + k_G^{\wedge}2\}/\{(n_{SiN} + n_G)^{\wedge}2 + k_G^{\wedge}2\}$. Here, $n_{SiN}$ is the refractive index of silicon nitride, $n_G$ is the refractive index of the gate electrode 12, and $k_G$ is the extinction coefficient of the gate electrode 12. Thus, $\Delta A'$ is calculated at 0.00176. This value is used to determine the range defined by the product of sets denoted by aforementioned L1 to L5 in (Expression 48).

Figure 12:
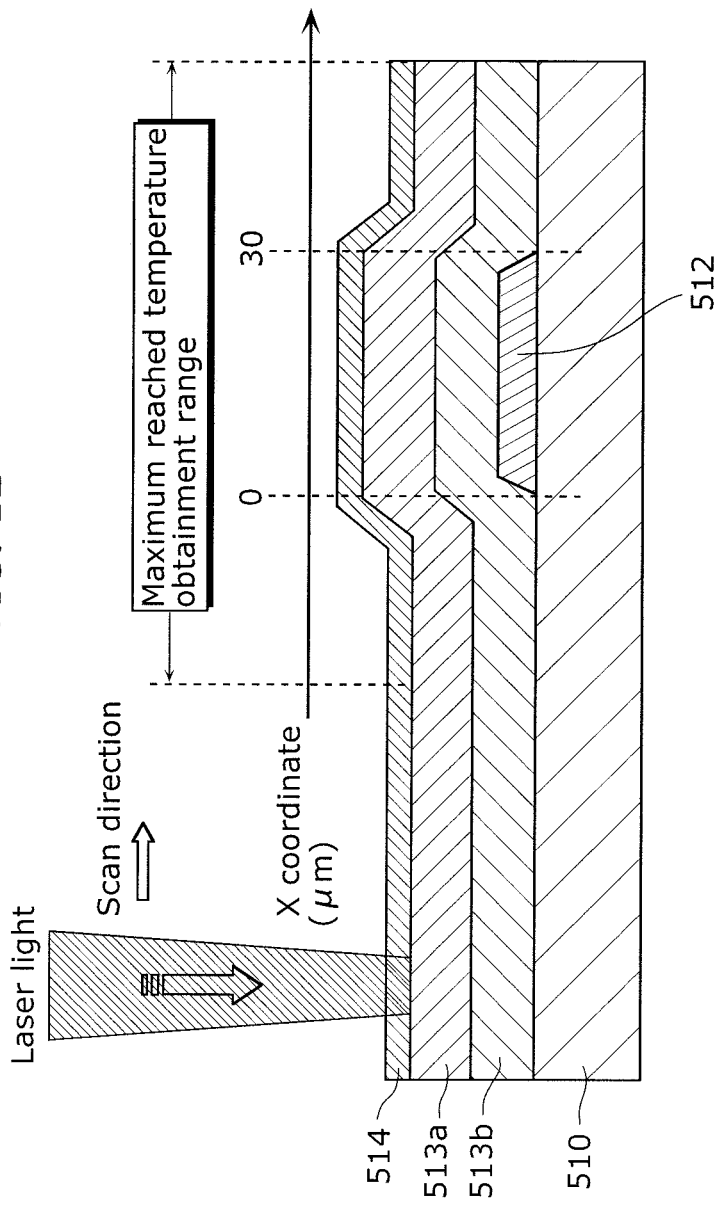
FIG. 12 is a diagram showing a model used for a simulation.

A simulation is performed on positional dependency of the maximum reached temperature of the surface of the amorphous silicon layer 14 when the models shown in FIGS. 7A and 7B are perpendicularly irradiated and scanned with green laser light of $\lambda$=532 nm. FIG. 12 shows a model used for the simulation. As shown in FIG. 12, the model includes a substrate 510, a gate electrode 512, a silicon nitride layer 513b, a silicon oxide layer 513a, and an amorphous silicon layer 514. In the model, the gate electrode 512 has a length of 30 μm in a laser scan direction, and the amorphous silicon layer 514 and the gate electrode 512 have physical properties corresponding to the aforementioned values.

Figure 13:
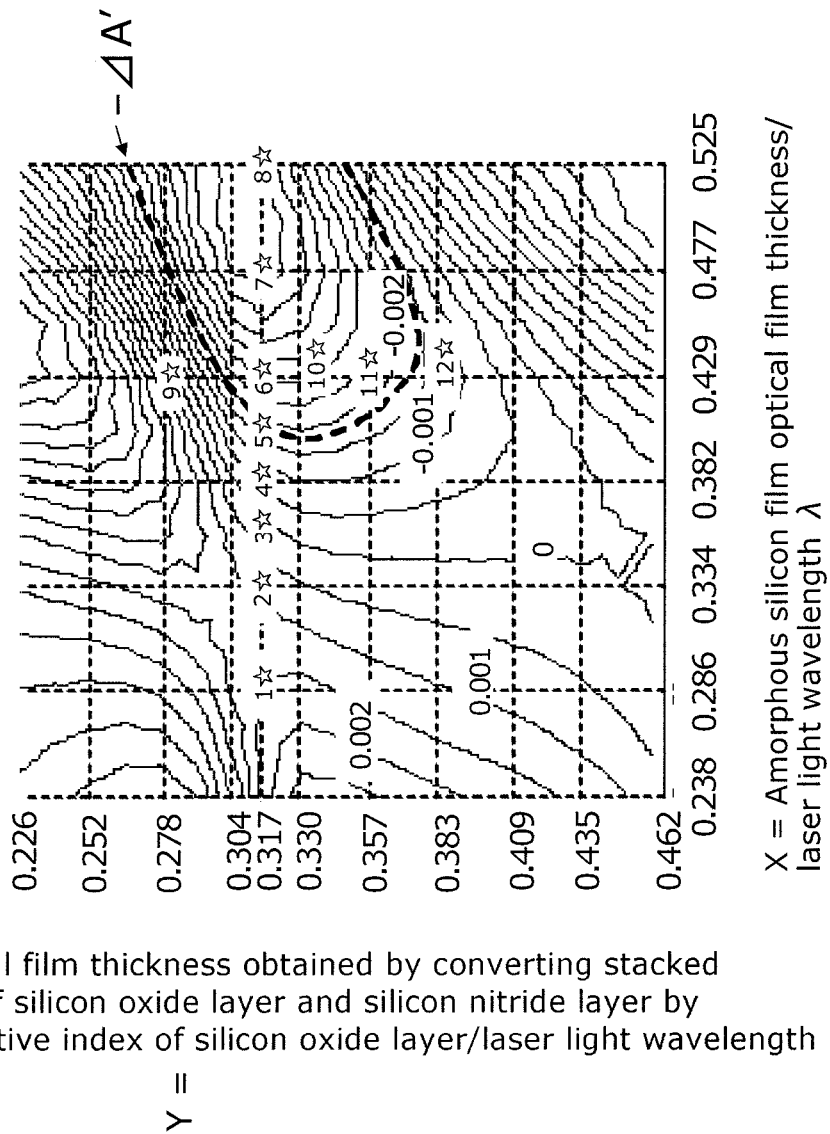
FIG. 13 is a diagram showing film thickness condition points in FIG. 8 which are subject to the simulation.

FIG. 13 is a diagram showing film thickness condition points in FIG. 8 which are subject to the simulation. In detail, points 1 to 12 (stars 1 to 12) marked with a star sign (☆) in FIG. 13 represent film thickness conditions which are subject to the simulation. The normalized absorptance difference $A_{Si1}'-A_{Si2}'$ at the stars 1, 2, 3, 4, 9, and 12 is more than $-\Delta A'$ (=−0.00176), whereas the normalized absorptance difference $A_{Si1}'-A_{Si2}'$ at the stars 5, 6, 7, 8, 10, and 11 is less than $-\Delta A'$. The stars 5, 6, 7, 8, 10, and 11 are located in the area on and inside the dotted line in FIG. 13.

For instance, at the star 1, the film thickness of the amorphous silicon layer 14 is 30 nm, and the film thicknesses of the silicon oxide layer 13a and the silicon nitride layer 13b are 85.0 nm/63.2 nm. This is an example corresponding to the case where $\lambda$=532 nm and the capacitance of the stacked film of the silicon oxide film and the silicon nitride film is equal to a capacitance of a silicon oxide single film of 120 nm in film thickness. Likewise, at the stars 2 to 8, the film thickness of the amorphous silicon layer 14 is respectively 35 nm, 37.5 nm, 40 nm, 42.5 nm, 45 nm, 50 nm, and 55 nm, and the film thicknesses of the silicon oxide layer 13a and the silicon nitride layer 13b are 85.0 nm/63.2 nm. At the stars 9 to 12, the film thicknesses of the silicon oxide layer 13a and the silicon nitride layer 13b are respectively 95.0 nm/54.1 nm, 75.0 nm/81.2 nm, 65.0 nm/99.3 nm, and 55.0 nm/117.3 nm, and the film thickness of the amorphous silicon layer 14 is 45 nm.

Figure 14:
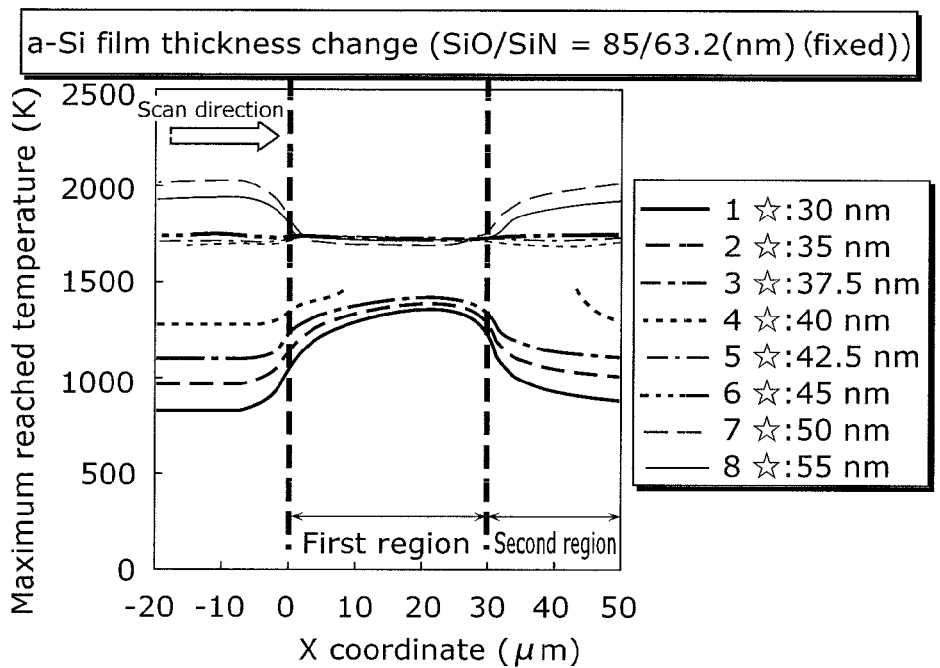
FIG. 14 is a diagram showing a simulation result of positional dependency of a maximum reached temperature of a surface of the amorphous silicon layer in a first region and a second region.
Figure 15:
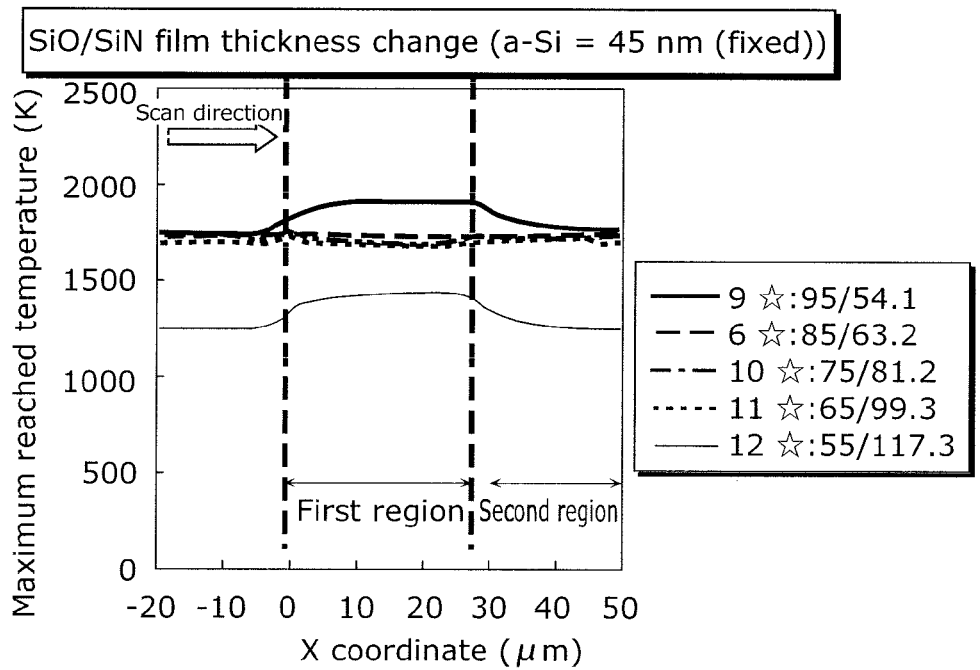
FIG. 15 is a diagram showing a simulation result of positional dependency of a maximum reached temperature of the surface of the amorphous silicon layer in the first region and the second region.

FIGS. 14 and 15 are diagrams showing results of simulating the positional dependency of the maximum reached temperature of the surface of the amorphous silicon layer 14 in the first region and the second region. A horizontal axis represents a position coordinate, whereas a vertical axis represents a maximum reached temperature of the surface of the amorphous silicon layer 14. FIG. 14 shows a simulation result for the film thickness conditions at the stars 1 to 8 shown in FIG. 13. In detail, FIG. 14 shows a simulation result when the film thickness of the amorphous silicon layer 14 is changed while fixing the film thickness of the gate insulation layer 13, at the stars 1 to 8 shown in FIG. 13. FIG. 15 shows a simulation result for the film thickness conditions at the stars 9, 6, 10, 11, and 12 shown in FIG. 13. In detail, FIG. 15 shows a simulation result when the film thicknesses of the silicon oxide layer 13a and of the silicon nitride layer 13b that constitute the gate insulation layer 13 are changed while fixing the film thickness of the amorphous silicon layer 14, at the stars 9, 6, 10, 11, and 12 shown in FIG. 13.

As shown in FIG. 14, in each of the film thickness conditions at the stars 1, 2, 3, and 4, a curve indicating the maximum reached temperature of the surface of the amorphous silicon layer 14 is not flat in the first region located above the gate electrode 12. In each of the film thickness conditions at the stars 5, 6, 7, and 8, on the other hand, a curve indicating the maximum reached temperature of the surface of the amorphous silicon layer 14 is flat in the first region located above the gate electrode 12. As shown in FIG. 15, in each of the film thickness conditions at the stars 9 and 12, a curve indicating the maximum reached temperature of the surface of the amorphous silicon layer 14 is not flat in the first region located above the gate electrode 12. In each of the film thickness conditions at the stars 6, 10, and 11, on the other hand, a curve indicating the maximum reached temperature of the surface of the amorphous silicon layer 14 is flat in the first region located above the gate electrode 12.

These simulation results demonstrate that, when the film thickness of the amorphous silicon layer 14 and the film thickness of the gate insulation layer 13 satisfy such a normalized absorptance difference $A_{Si1}'-A_{Si2}'$ between the amorphous silicon layer 14 in the first region and the amorphous silicon layer 14 in the second region that is in the area on and inside the contour represented by $-\Delta A'$, a uniform distribution of the reached temperature of the amorphous silicon layer 14 in the first region in the thin-film transistor 100 by heat generation can be attained. As a result, the amorphous silicon layer 14 in the first region in the thin-film transistor 100 can be sufficiently and uniformly crystallized to produce the crystalline silicon layer 15.

Note that FIG. 11 also shows, as more preferable areas, areas F1 and F2 in the area on and inside the contour represented by $-\Delta A'$ (i.e. in the area enclosed with the dotted line).

The area F1 shown in FIG. 11 is a more preferable area in the area enclosed with the dotted line. This is because, in the area on and inside the contour represented by $-\Delta A'$, the area F1 is such an area where the gate breakdown voltage of the thin-film transistor 100 can be enhanced without excessively increasing a fixed charge in the silicon nitride film included in the gate insulation layer 13. This prevents a situation where a threshold voltage of the thin-film transistor 100 is significantly shifted from 0 V. Besides, since the silicon nitride layer is limited to a proper thickness, problems such as cracks, film peeling, and insufficient dehydrogenation caused by an increase in thickness of the silicon nitride film can be suppressed. Hence, a productivity decline in thin-film transistor manufacturing can be avoided. The preferable area F1 is represented by aforementioned (Expression 6) and (Expression 7).

The area F2 shown in FIG. 11 is a more preferable area in the area F1. This is because, in the area on and inside the contour represented by $-\Delta A'$, the area F2 is such an area where the contour is flatter. By forming the silicon nitride layer 13b, the silicon oxide layer 13a, and the amorphous silicon layer 14 in the thin-film transistor 100 with the respective film thicknesses in a range that satisfies a conditional expression defined by the area F2, it is possible to achieve an advantageous effect of producing the crystalline silicon layer 15 in which a variation in crystallinity is suppressed, even when the film thicknesses change from the target film thicknesses by approximately 10%. Thus, the range that satisfies the conditional expression defined by the area F2 is preferable because a process margin is allowed. As an example, when $\lambda$=532 nm, forming the gate insulation layer 13 (the silicon oxide layer 13a and the silicon nitride layer 13b) with the film thickness in this more preferable area F2 is equivalent to forming the gate insulation layer 13 (the silicon oxide layer 13a and the silicon nitride layer 13b) with the film thickness so that the silicon oxide layer converted optical film thickness (the value obtained by dividing, by the refractive index of the silicon oxide layer 13a, the sum of the optical thickness of the silicon oxide layer 13a which is the result of multiplying the film thickness of the silicon oxide layer 13a by the refractive index of the silicon oxide layer 13a and the optical film thickness of the silicon nitride layer 13b which is the result of multiplying the film thickness of the silicon nitride layer 13b by the refractive index of the silicon nitride layer 13b) is in a range of 159.6 to 175.56.

FIG. 16 is a diagram showing an example of the film thickness of the silicon oxide layer 13a and the film thickness of the silicon nitride layer 13b in the more preferable area F2. In FIG. 16, the film thickness of the silicon oxide layer 13a and the film thickness of the silicon nitride layer 13b calculated for C=140 nm, C=120 nm, and C=100 nm when λ=532 nm are shown as an example. In detail, when the silicon oxide layer converted optical film thickness is 159.6, the silicon oxide layer 13a and the silicon nitride layer 13b for C=140 nm, C=120 nm, and C=100 nm are respectively 124.3 nm/28.3 nm, 90.0 nm/54.1 nm, 55.7 nm/80.0 nm in film thickness.

The following describes a result of verifying that the range that satisfies the conditional expression defined by the area F2 has the process margin.

FIGS. 17 to 20 show results of calculating the absorptance of silicon in the first region and the second region, when the film thickness of the amorphous silicon layer 14 is changed while maintaining the constant total capacitance and fixing the film thicknesses of the silicon oxide layer 13a and the silicon nitride layer 13b.

Figure 17:
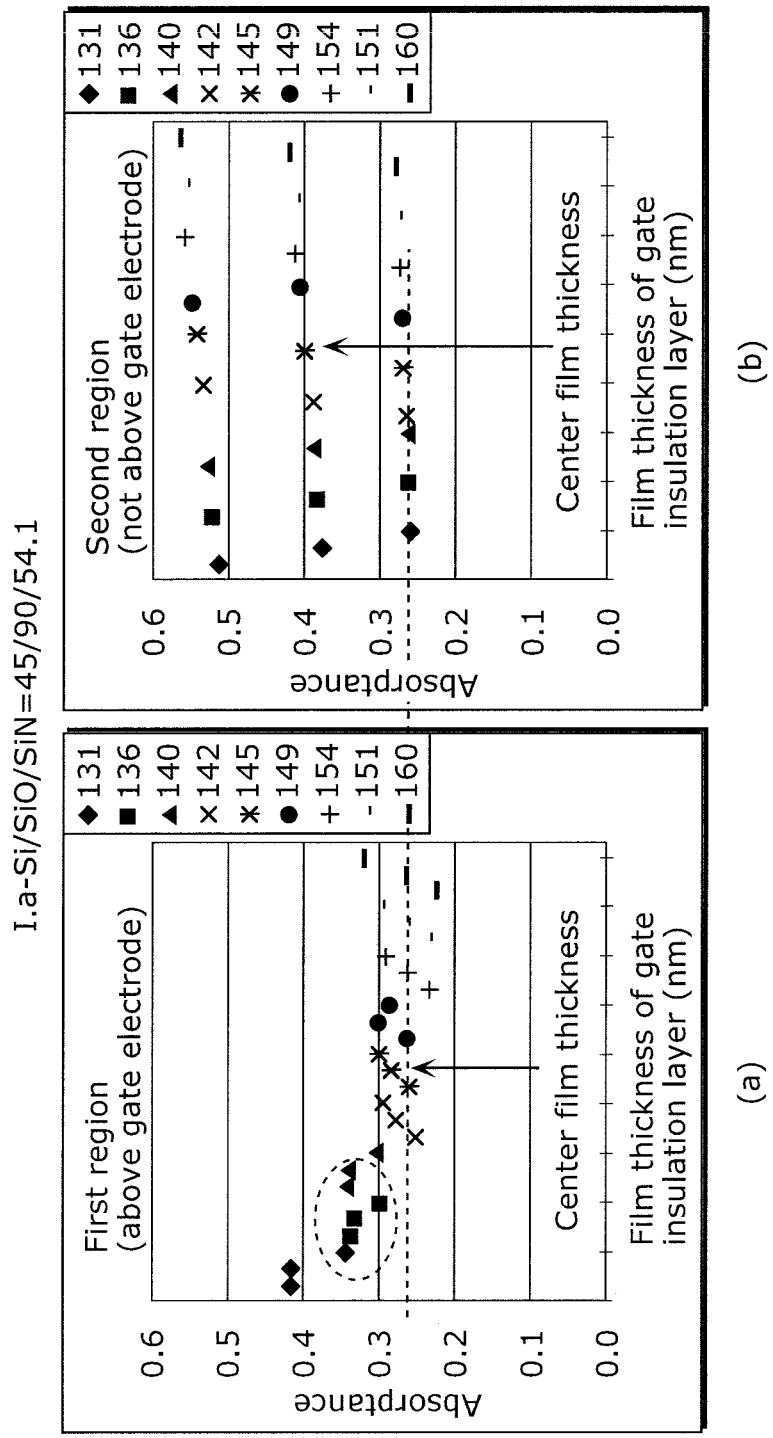
FIG. 17 is a diagram showing a calculation result of an absorptance of silicon in the first region and the second region in the case where the amorphous silicon layer is 45 nm in film thickness.

FIG. 17 is a diagram showing a result of calculating the absorptance of silicon in the first region and the second region in the case where the amorphous silicon layer 14 is 45 nm in film thickness. That is, FIG. 17 is a diagram for verifying the process margin in the case where the film thickness of the amorphous silicon layer 14 is 45 nm while maintaining C=120 nm and fixing the film thicknesses of the silicon oxide layer 13a and the silicon nitride layer 13b at 90 nm/54.1 nm. In FIG. 17, the film thicknesses of the silicon oxide layer 13a, the silicon nitride layer 13b, and the amorphous silicon layer 14 of 90 nm/54.1 nm/45 nm are set as center film thicknesses, and the absorption of silicon in the first region and the second region in the case of changing the film thicknesses of the silicon oxide layer 13a, the silicon nitride layer 13b, and the amorphous silicon layer 14 by ±10% (using film thickness levels of 3×3×3=27 as samples) is calculated.

Figure 18:
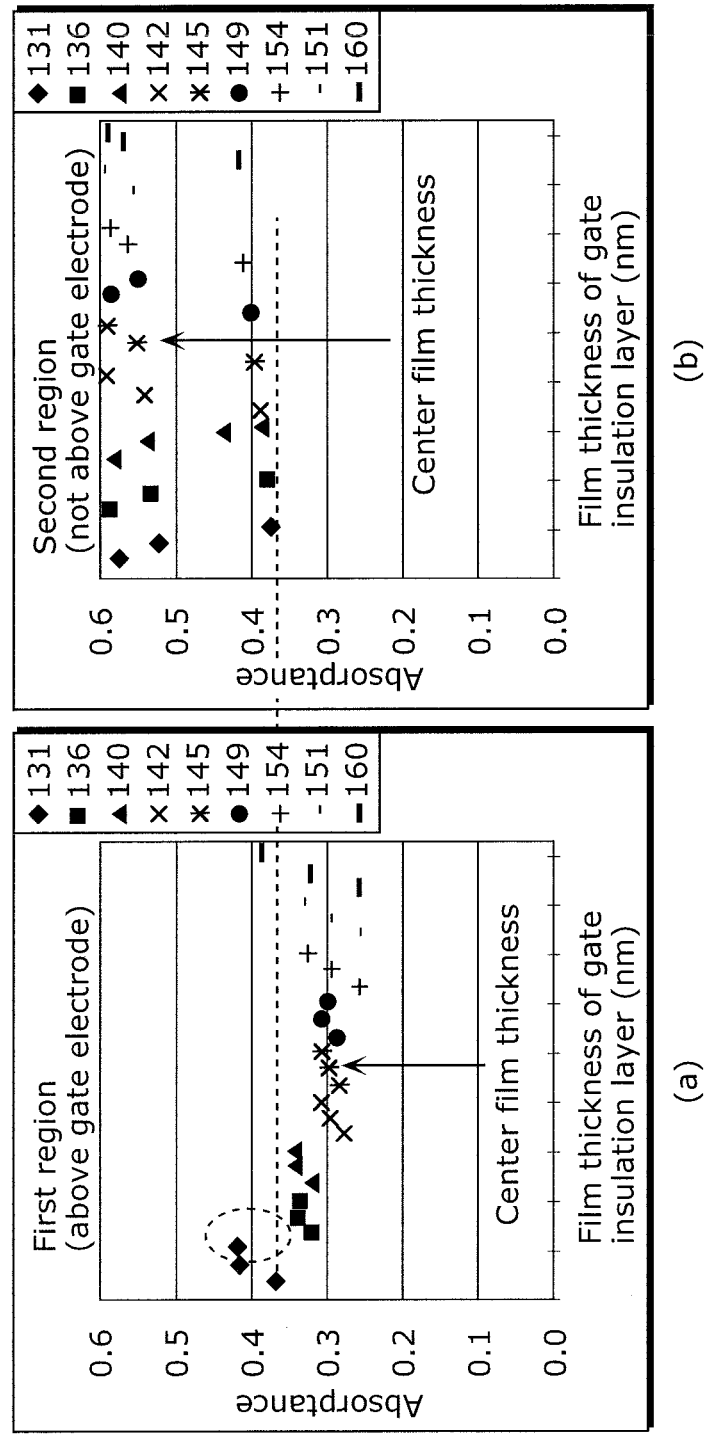
FIG. 18 is a diagram showing a calculation result of an absorptance of silicon in the first region and the second region in the case where the amorphous silicon layer is 50 nm in film thickness.

FIG. 18 is a diagram showing a result of calculating the absorptance of silicon in the first region and the second region in the case where the amorphous silicon layer 14 is 50 nm in film thickness. That is, FIG. 18 is a diagram for verifying the process margin in the case where the film thickness of the amorphous silicon layer 14 is 50 nm while maintaining C=120 nm and fixing the film thicknesses of the silicon oxide layer 13a and the silicon nitride layer 13b at 90 nm/54.1 nm. In FIG. 18, the film thicknesses of the silicon oxide layer 13a, the silicon nitride layer 13b, and the amorphous silicon layer 14 of 90 nm/54.1 nm/50 nm are set as center film thicknesses, and the absorption of silicon in the first region and the second region in the case of changing the film thicknesses of the silicon oxide layer 13a, the silicon nitride layer 13b, and the amorphous silicon layer 14 by ±10% is calculated.

Figure 19:
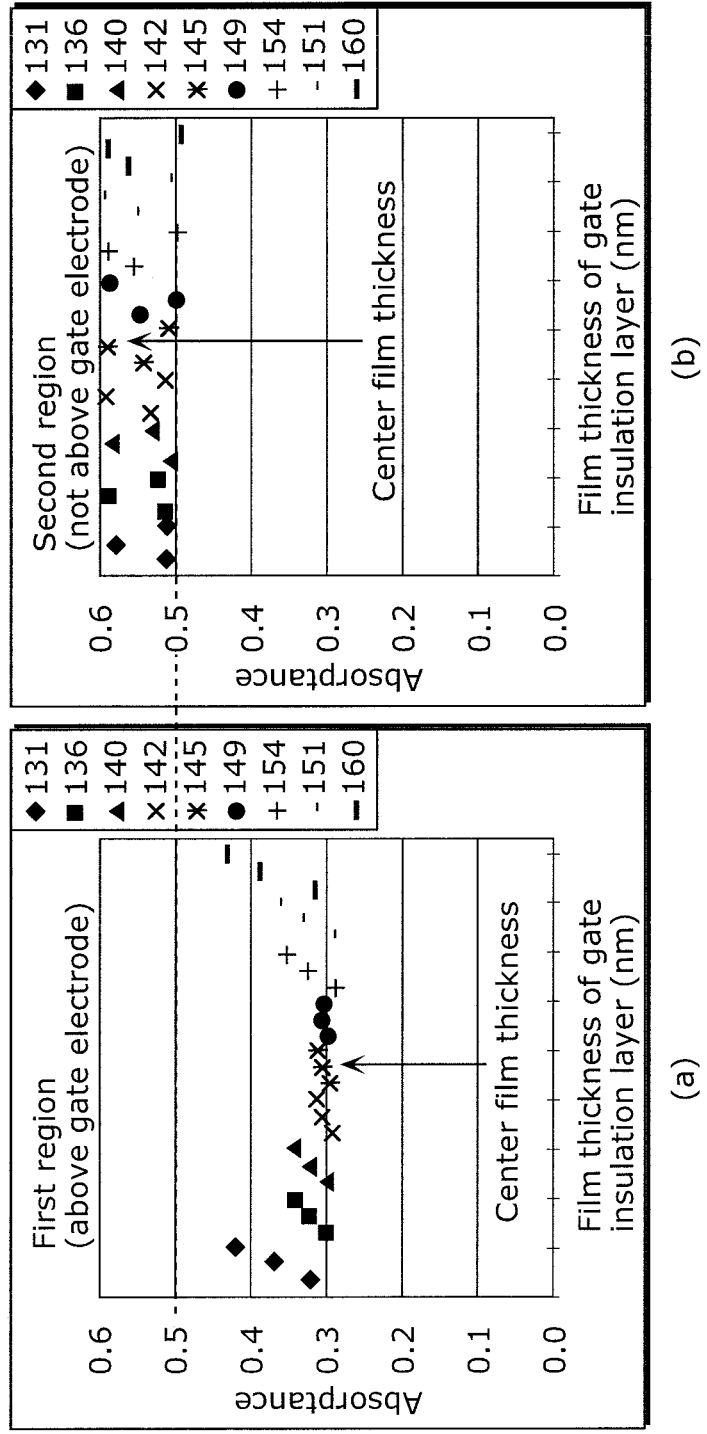
FIG. 19 is a diagram showing a calculation result of an absorptance of silicon in the first region and the second region in the case where the amorphous silicon layer is 55 nm in film thickness.
Figure 20:
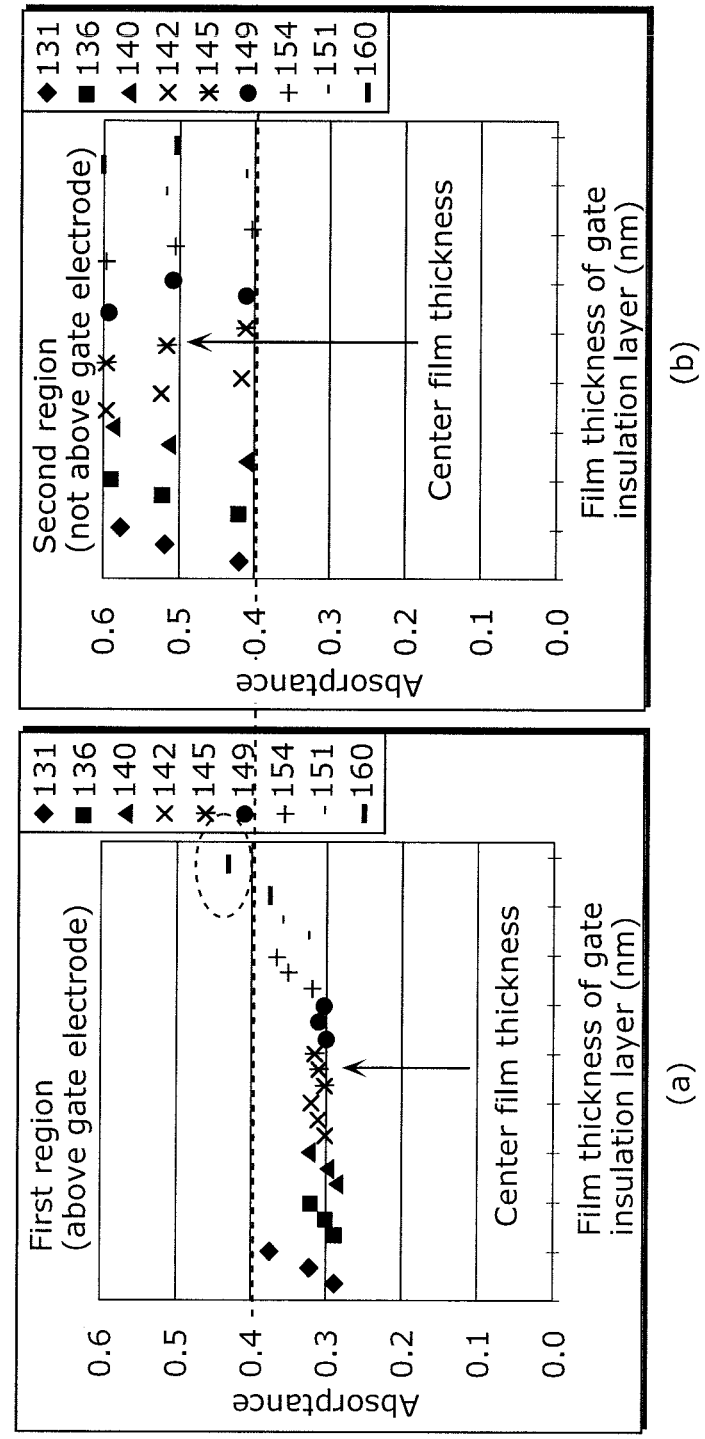
FIG. 20 is a diagram showing a calculation result of an absorptance of silicon in the first region and the second region in the case where the amorphous silicon layer is 60 nm in film thickness.

Likewise, FIG. 19 is a diagram showing a result of calculating the absorptance of silicon in the first region and the second region in the case where the amorphous silicon layer 14 is 55 nm in film thickness. FIG. 20 is a diagram showing a result of calculating the absorptance of silicon in the first region and the second region in the case where the amorphous silicon layer 14 is 60 nm in film thickness. In FIG. 19, the film thicknesses of the silicon oxide layer 13a, the silicon nitride layer 13b, and the amorphous silicon layer 14 of 90 nm/54.1 nm/55 nm are set as center film thicknesses. In FIG. 20, the film thicknesses of the silicon oxide layer 13a, the silicon nitride layer 13b, and the amorphous silicon layer 14 of 90 nm/54.1 nm/60 nm are set as center film thicknesses.

Whether or not the process margin is allowed can be verified by checking whether or not there are many film thickness levels at which the absorptance of silicon is higher in the second region (not located above the gate electrode) than in the first region (located above the gate electrode) in FIGS. 17 to 20.

In FIGS. 17 and 18, the absorptance of silicon is higher in the first region (located above the gate electrode) than in the second region (not located above the gate electrode), at film thickness levels (part of film thickness levels) in areas enclosed with dotted circles. In FIG. 19, on the other hand, the absorptance of silicon is higher in the second region (not located above the gate electrode) than in the first region (located above the gate electrode), at all film thickness levels. In FIG. 20, the absorptance of silicon is higher in the first region (located above the gate electrode) than in the second region (not located above the gate electrode), only at one film thickness level.

These results demonstrate that the range that satisfies the conditional expression defined by the area F2 has the process margin. That is, in the range of the preferable area F2, the crystalline silicon layer 15 in which a variation in crystallinity is suppressed can be produced even when the film thicknesses of the silicon oxide layer 13a, the silicon nitride layer 13b, and the amorphous silicon layer 14 change from their target film thicknesses by approximately 10%.

Figure 21B:
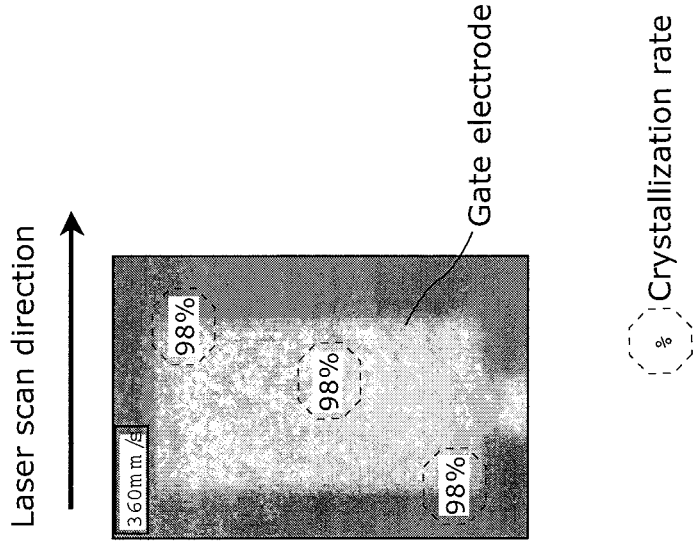
FIG. 21B is a diagram showing crystallinity of the crystalline silicon layer in the case where laser annealing crystallization is performed on the structure of the embodiment of the present invention using the solid-state laser in the visible region.
Figure 21A:
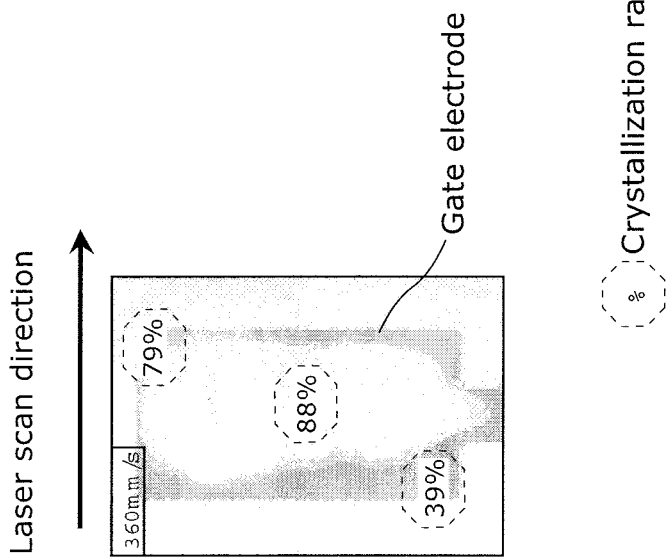
FIG. 21A is a diagram showing crystallinity of the crystalline silicon layer in the case where laser annealing crystallization is performed on a conventional structure using the solid-state laser in the visible region.

This is summarized as follows. Typically, in the case where the gate electrode is located below the amorphous silicon layer via the gate insulation layer in the laser crystallization process, insufficient and non-uniform heat generation of the amorphous silicon layer located above the gate electrode is caused by heat absorption and heat transmission by the gate electrode. This leads to a variation in crystallinity in the resulting crystalline silicon layer. By depositing the amorphous silicon layer and its underlying insulation layer in the aforementioned film thickness ranges, however, crystallization can be performed while suppressing the influence of heat absorption and heat transmission by the gate electrode in the laser crystallization process, as shown in FIG. 21B. Hence, the thin-film transistor (TFT) including the amorphous silicon layer and its underlying gate insulation layer can exhibit uniform thin-film transistor characteristics. FIG. 21A is a diagram showing crystallinity of the crystalline silicon layer in the case of performing laser annealing crystallization on a conventional structure using the solid-state laser in the visible region. FIG. 21B is a diagram showing crystallinity of the crystalline silicon layer in the case of performing laser annealing crystallization on the structure of the embodiment of the present invention using the solid-state laser in the visible region. FIGS. 21A and 21B show an example where the energy density of the laser light per unit time is 60 KW/cm², and a laser scan speed is 360 mm/s. As can be understood from these drawings, the structure of the embodiment of the present invention exhibits not only a high crystallization rate, i.e. improved crystallinity, but also uniform crystallinity above the gate electrode, as compared with the conventional structure.

Figure 22:
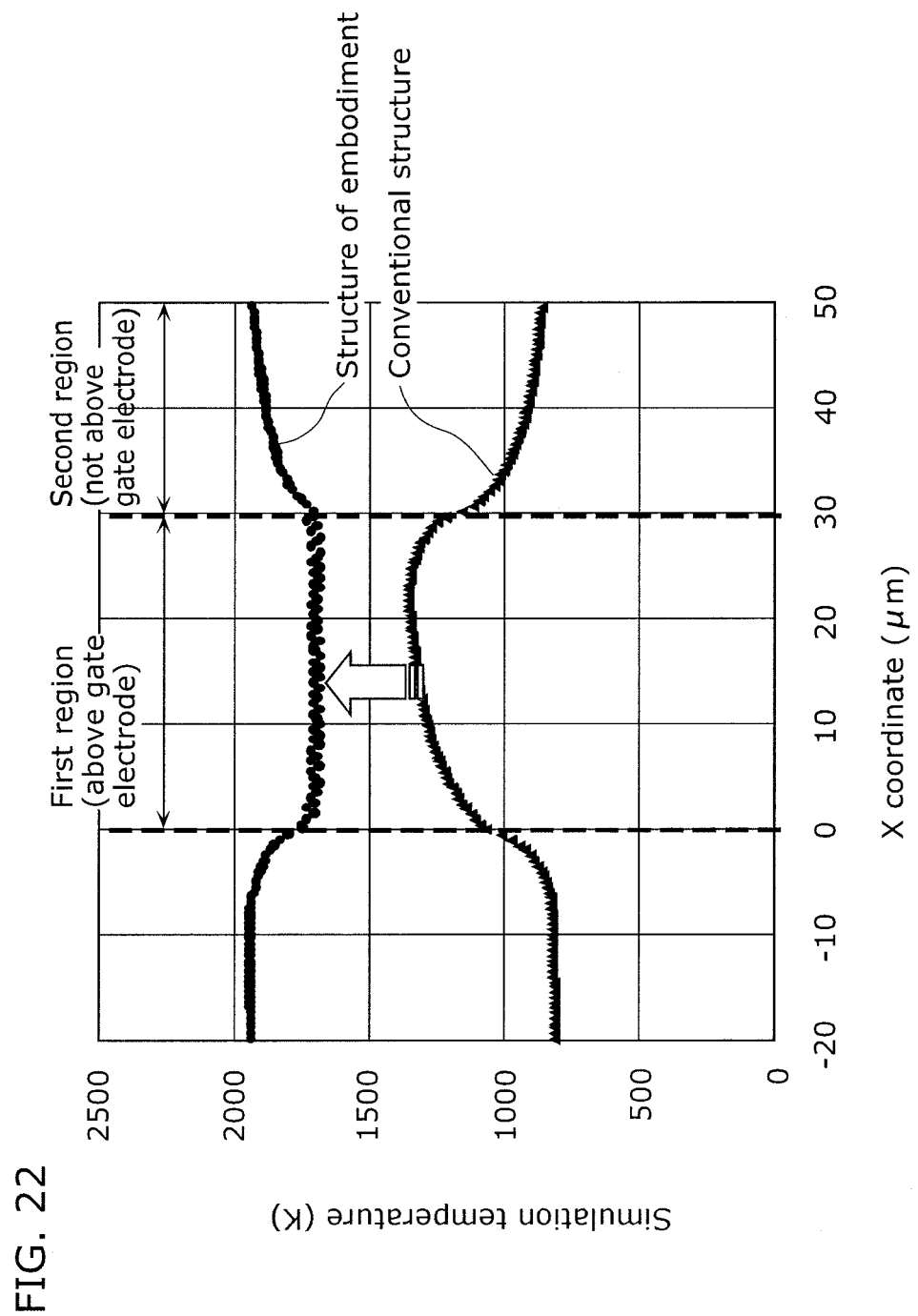
FIG. 22 is a diagram for describing advantageous effects of the embodiment of the present invention.

FIG. 22 is a diagram for describing advantageous effects of the embodiment of the present invention. In FIG. 22, the region other than the gate electrode 12, namely, the heat generation of the amorphous silicon layer 14 not located above the gate electrode 12 (i.e. in the second region), is utilized as a means of thermally saturating the gate electrode 12. In more detail, by setting the film thickness of the amorphous silicon layer 14 and the film thickness of the gate insulation layer 13 in the appropriate ranges, a difference in light interference effect depending on whether or not the gate electrode 12 is present is exploited so that (1) the amorphous silicon layer 14 not located above the gate electrode 12 has a higher light absorptance than the amorphous silicon layer 14 located above the gate electrode 12, that is, the amorphous silicon layer 14 not located above the gate electrode 12 (i.e. in the second region) generates more heat than the amorphous silicon layer 14 located above the gate electrode 12 (i.e. in the first region) when laser annealing is performed, and also (2) the silicon thin film located above the gate electrode 12 (i.e. in the first region) has a higher heat generation temperature than a melting point of silicon.

Owing to the advantageous effect (1), heat generated in the amorphous silicon layer 14 in the second region can be transmitted to and absorbed by the gate electrode 12. This allows the gate electrode 12 to be thermally saturated before the laser light anneals the amorphous silicon layer 14 located above the gate electrode 12 (i.e. in the first region). Hence, the influence of heat absorption and heat transmission by the gate electrode 12 on the crystallization of the amorphous silicon layer 14 located above the gate electrode 12 (i.e. in the first region) can be reduced. Moreover, owing to the advantageous effect (2), even in the case where the silicon thin film not located above the gate electrode 12 (i.e. in the second region) has an excessively higher light absorptance than the silicon thin film located above the gate electrode 12 (i.e. in the first region), that is, even in the case where the amorphous silicon layer 14 not located above the gate electrode 12 (i.e. in the second region) generates excessively more heat than the amorphous silicon layer 14 located above the gate electrode 12 (i.e. in the first region), both the amorphous silicon layer 14 located above the gate electrode 12 (i.e. in the first region) and the amorphous silicon layer 14 not located above the gate electrode 12 (i.e. in the second region) melt to become a molten silicon layer, as a result of which the heat conductivity of the amorphous silicon layer 14 increases to a substantially same level as a heat conductivity of metal typically used as the gate electrode 12.

Accordingly, heat generated from the molten silicon layer not located above the gate electrode 12 (i.e. in the second region) is mainly transmitted to the molten silicon layer located above the gate electrode 12 (i.e. in the first region), and thus kept from being excessively absorbed by the gate electrode 12 via the gate insulation layer 13. Therefore, the temperature distribution of the gate electrode 12 is kept from deterioration, and so the heat generation temperature distribution of the amorphous silicon layer 14 located above the gate electrode 12 (i.e. in the first region) is unaffected.

Thus, the combination of the advantageous effects (1) and (2) ensures a uniform heat generation temperature distribution of the amorphous silicon layer 14 located above the gate electrode 12 (i.e. in the first region). This leads to an advantageous effect of ensuring a uniform crystal structure in the crystalline silicon layer 15 produced by crystallization.

As described above, according to the present invention, it is possible to realize a thin-film transistor device manufacturing method, a thin-film transistor, and a display device using the thin-film transistor in which a crystalline silicon film of stable crystallinity can be formed using a laser of a wavelength in the visible region. In detail, it is possible to realize a thin-film transistor device manufacturing method, a thin-film transistor, and a display device using the thin-film transistor in which a crystalline silicon layer of stable crystallinity can be formed using a laser of a wavelength in the visible region by forming a silicon thin film and a gate insulation layer with respective film thicknesses that satisfy a predetermined condition, without a need for a particular change in thin-film transistor structure such as a gate electrode pattern shape.

Figure 23:
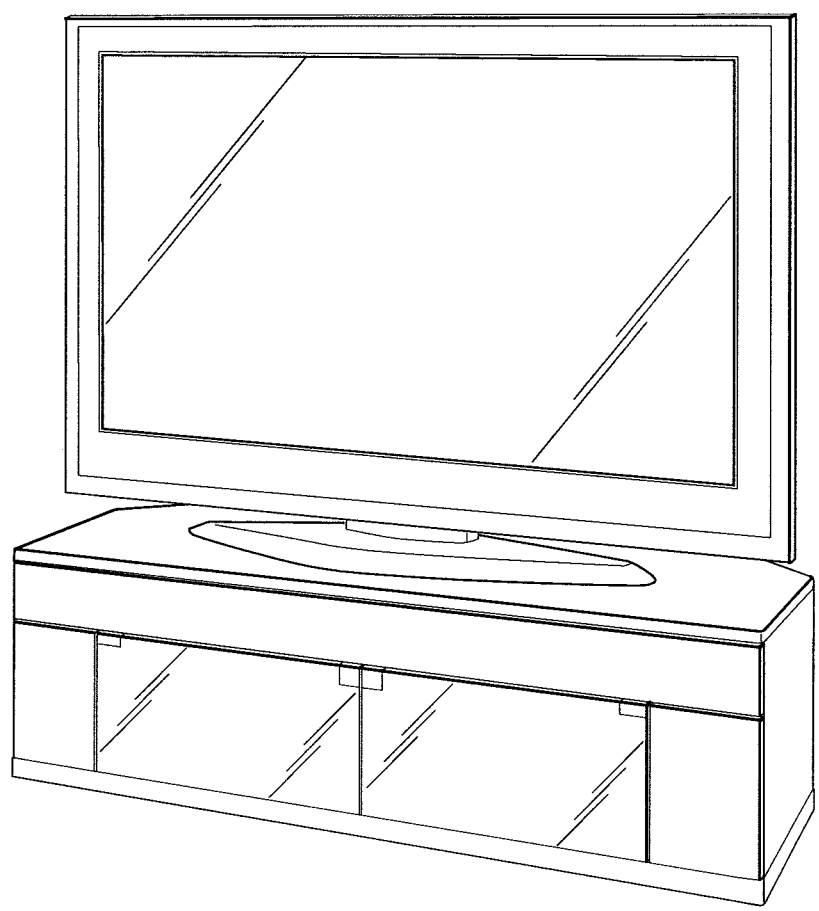
FIG. 23 is a diagram showing an example of the display device that uses the thin-film transistor according to the present invention.

Moreover, a display device of high image quality with uniform TFT characteristics can be realized in the case where the thin-film transistor according to the present invention is used in a display device shown in FIG. 23. With such improvement in display quality, increased yields and reduced costs can be achieved, too.

The present invention achieves the advantageous effects merely by setting the aforementioned range of film thickness condition, without a need for a particular change in thin-film transistor structure such as a gate electrode pattern shape. Thus, the present invention is superior to the conventional art in that design flexibility is ensured even in the case of, for example, manufacturing a display device of a higher resolution.

Though the thin-film transistor device manufacturing method, the thin-film transistor, and the display device using the thin-film transistor according to the present invention have been described by way of the embodiment, the present invention is not limited to the embodiment. Modifications obtained by applying various changes conceivable by those skilled in the art to the embodiment and any combinations of components in different embodiments are also included in the present invention without departing from the scope of the present invention.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to a thin-film transistor device manufacturing method, a thin-film transistor, and a display device including a liquid crystal panel or an EL panel such as an organic EL panel using the thin-film transistor. The present invention is particularly applicable to, for example, manufacturing of a display device including a liquid crystal panel or an EL panel such as an organic EL panel of high image quality with uniform TFT characteristics because, in the case where a gate electrode is located below an amorphous silicon layer via a gate insulation film in a laser crystallization process, stable crystallization can be performed while suppressing an influence of heat absorption and heat transmission by the gate electrode.

What is claimed is:

1. A thin-film transistor device manufacturing method comprising:
   providing a substrate;
   forming a plurality of gate electrodes above the substrate;
   forming a silicon nitride layer on the plurality of gate electrodes;
   forming a silicon oxide layer on the silicon nitride layer;
   forming an amorphous silicon layer on the silicon oxide layer;
   crystallizing the amorphous silicon layer using laser light emitted from a predetermined laser of at least 473 nm and at most 561 nm in wavelength while moving the predetermined laser in a direction relative to the substrate, to produce a crystalline silicon layer; and forming a source electrode and a drain electrode on the crystalline silicon layer in a region that corresponds to each of the plurality of gate electrodes, wherein a film thickness of the silicon oxide layer, a film thickness of the silicon nitride layer, and a film thickness of the amorphous silicon layer define a value X and a value Y, the value X is obtained by dividing an optical film thickness of the amorphous silicon layer by a wavelength of the laser light, the optical film thickness of the amorphous silicon layer being a product of multiplying the film thickness of the amorphous silicon layer and a refractive index of the amorphous silicon layer, the value Y is obtained by dividing a silicon oxide layer converted optical film thickness by the wavelength of the laser light, the silicon oxide layer converted optical film thickness being obtained by dividing a sum of an optical film thickness of the silicon oxide layer and an optical film thickness of the silicon nitride layer by a refractive index of the silicon oxide layer, the optical film thickness of the silicon oxide layer being a product of multiplying the film thickness of the silicon oxide layer by the refractive index of the silicon oxide layer, the optical film thickness of the silicon nitride layer being a product of multiplying the film thickness of the silicon nitride layer by a refractive index of the silicon nitride layer, and the value X and the value Y satisfy:

$Y \leq -0.198X + (0.343 - 10.83\Delta A');$ $Y \geq -0.236X + (0.481 - 8.83\Delta A');$ $X \geq 0.346 + C3$ where $C3 = -36\Delta A' + 0.0007$ when $0 > \Delta A' > -0.0011$ and $C3 = -18.636\Delta A' + 0.0198$ when $-0.0011 \geq \Delta A';$ $Y > 0.435 + C4$ where $C4 = 52\Delta A' - 0.0033$ when $0 > \Delta A' > -0.00104$ and $C4 = 14.582\Delta A' - 0.0422$ when $-0.00104 \geq \Delta A';$ and $Y \geq (0.00053/(-\Delta A')^{1.18}) \times (X - 0.346) + 0.291$ where $0 > \Delta A',$ $\Delta A'$ is calculated according to an expression of:

$(A_G/d_G) \times (\rho_{Si} \times c_{Si})/(\rho_G \times c_G),$ where $\rho_{Si}$ is a density of the amorphous silicon layer,
$c_{Si}$ is a specific heat of the amorphous silicon layer,
$d_G$ is a film thickness of the gate electrode,
$\rho_G$ is a density of the gate electrode,
$c_G$ is a specific heat of the gate electrode, and
$A_G$ is a maximum absorptance of the gate electrode when a first part of the amorphous silicon layer above the gate electrode and a second part of the amorphous silicon layer not above the gate electrode have an equal light absorptance for the laser light.

2. The thin-film transistor device manufacturing method according to claim 1,
wherein, when crystallizing the amorphous silicon layer, the predetermined laser emits the laser light in an oscillation mode that is one of a continuous wave mode and a quasi-continuous wave mode.

3. The thin-film transistor device manufacturing method according to claim 1,
wherein the predetermined laser is in a solid-state laser device.

4. The thin-film transistor device manufacturing method according to claim 1,
wherein the predetermined laser is in a laser device that uses a semiconductor laser element.

5. The thin-film transistor device manufacturing method according to claim 1,
wherein, when crystallizing the amorphous silicon layer, a variation in irradiation energy density of the laser light on the amorphous silicon layer is less than approximately 5%.

6. The thin-film transistor device manufacturing method according to claim 1,
wherein the silicon nitride layer and the silicon oxide layer are formed with the respective film thicknesses so that a capacitance of a series capacitor composed of the silicon nitride layer and the silicon oxide layer is approximately equal to a capacitance of a silicon oxide single layer of at least approximately 100 nm and at most approximately 140 nm in film thickness.

7. The thin-film transistor device manufacturing method according to claim 6,
wherein the value X and the value Y further satisfy:

$0.410 \leq X \leq 0.525;$ and $0.300 \leq Y \leq 0.330.$

8. The thin-film transistor device manufacturing method according to claim 6,
wherein the wavelength of the laser light is approximately 532 nm.

9. The thin-film transistor device manufacturing method according to claim 6,
wherein the silicon oxide layer converted optical film thickness is at least approximately 159.6 nm and at most approximately 175.56 nm.

10. The thin-film transistor device manufacturing method according to claim 6,
wherein the film thickness of the amorphous silicon layer is at least approximately 55 nm and at most approximately 60 nm.

11. The thin-film transistor device manufacturing method according to claim 1,
wherein forming the plurality of gate electrodes above the substrate includes:
forming an undercoat layer made of silicon oxide on the substrate; and
forming the plurality of gate electrodes on the undercoat layer.

12. A thin-film transistor device manufacturing method, comprising:
providing a substrate;
forming a plurality of gate electrodes above the substrate;
forming a silicon nitride layer on the plurality of gate electrodes;
forming a silicon oxide layer on the silicon nitride layer;
forming an amorphous silicon layer on the silicon oxide layer;
crystallizing the amorphous silicon layer using laser light emitted from a predetermined laser of at least 473 nm and at most 561 nm in wavelength while moving the predetermined laser in a direction relative to the substrate, to produce a crystalline silicon layer; and
forming a source electrode and a drain electrode on the crystalline silicon layer in a region that corresponds to each of the plurality of gate electrodes,
wherein the plurality of gate electrodes, the silicon nitride layer, the silicon oxide layer, and the amorphous silicon layer are formed so that, when the amorphous silicon layer is irradiated with the laser light, a maximum reached temperature of the amorphous silicon layer in a first region not above the gate electrode is higher than a maximum reached temperature of the amorphous silicon layer in a second region above the gate electrode and so that the amorphous silicon layer in the second region above the gate electrode has a substantially uniform maximum reached temperature, the second region not above the gate electrode being upstream in the direction of the relative movement of the predetermined laser.

13. The thin-film transistor device manufacturing method according to claim 12,
wherein the plurality of gate electrodes, the silicon nitride layer, the silicon oxide layer, and the amorphous silicon layer are formed so that with respective film thicknesses so that, when the amorphous silicon layer is irradiated with the laser light, the maximum reached temperature of the amorphous silicon layer in the first region not above the gate electrode is higher than the maximum reached temperature of the amorphous silicon layer in the second region above the gate electrode and so that the amorphous silicon layer in the second region above the gate electrode has the substantially uniform maximum reached temperature.

14. The thin-film transistor device manufacturing method according to claim 1, wherein, during emission of the laser light, a heat generation temperature of the amorphous silicon layer above the plurality of gate electrodes increases beyond a melting point of the amorphous silicon layer.

15. The thin-film transistor device manufacturing method according to claim 12, wherein, during emission of the laser light, a heat generation temperature of the amorphous silicon layer above the plurality of gate electrodes increases beyond a melting point of the amorphous silicon layer.

* * * * *